United States Patent [19]

Marvell et al.

[11] Patent Number: 5,401,212
[45] Date of Patent: Mar. 28, 1995

[54] ENVIRONMENTAL CONTROL SYSTEM

[75] Inventors: Greg A. Marvell, Lawrenceville; Robert M. Genco, Atlanta; Gregory K. Mundt, Duluth; Michael B. Tanaka, Atlanta, all of Ga.

[73] Assignee: Intelligent Enclosures Corporation, Norcross, Ga.

[21] Appl. No.: 33,892

[22] Filed: Mar. 19, 1993

Related U.S. Application Data

[63] Continuation-in-part of Ser. No. 10,534, Jan. 28, 1993, abandoned, which is a continuation-in-part of Ser. No. 688,645, Apr. 19, 1991, Pat. No. 5,195,922, which is a continuation-in-part of Ser. No. 574,970, Aug. 29, 1990, Pat. No. Des. 331,117.

[51] Int. Cl.$^6$ .......................... F24F 3/16; F24F 7/007
[52] U.S. Cl. ....................................... 454/187; 454/57
[58] Field of Search ...................... 454/56, 57, 58, 61, 454/62, 187

[56] References Cited

U.S. PATENT DOCUMENTS

| | | | |
|---|---|---|---|
| 3,115,819 | 12/1963 | Mahlmeister et al. | 454/187 |
| 3,745,908 | 7/1973 | Mayberry . | |
| 3,874,754 | 4/1975 | Saunders et al. | 454/56 X |
| 4,409,889 | 10/1983 | Burleson | 454/187 |
| 4,506,595 | 3/1985 | Roberts et al. | 454/187 |
| 4,666,477 | 5/1987 | Lough . | |
| 4,723,480 | 2/1988 | Yagi et al. . | |
| 4,880,581 | 11/1984 | Dastoli et al. . | |
| 4,923,352 | 5/1990 | Tamura et al. . | |
| 4,927,438 | 5/1990 | Mears et al. | 454/56 X |
| 4,963,069 | 10/1990 | Wurst et al. . | |
| 4,976,815 | 12/1990 | Hiratsuka et al. . | |

FOREIGN PATENT DOCUMENTS

| | | | |
|---|---|---|---|
| 2356780 | 5/1985 | Germany . | |
| 3422900 | 1/1986 | Germany . | |
| 127033 | 7/1983 | Japan . | |
| 63742 | 3/1984 | Japan . | |
| 59-95327 | 6/1984 | Japan | 454/238 |
| 577833 | 7/1976 | Switzerland | 454/56 |

OTHER PUBLICATIONS

Paper entitled "Observations Regarding the New Electrostatic Air Filtration Technology, Y²/Ultra-Filter," Yujiro Yamamoto Ph.D., (undated), 9 pages.
Article entitled "Invention Promises Cleaner Air, Gases," *Microcontamination,* Apr. 1991, pp. 12, 16.
Federal Standard 209D, entitled "Clean Room and Work Station Requirements, Controlled Environment," Jun. 15, 1988, 50 pages.
Promotional literature entitled "MICROVOID® Relocatable Vertical Laminar Flow Clean Room," (undated), 2 pages.
Promotional literature entitled "Modular Cleanrooms," Pure Aire Corporation, (undated), 7 pages.
Article entitled "The Costly Race Chipmakers Can't Afford to Lose," *Business Week,* Dec. 10, 1990, pp. 185, 186, 188.
Advertisement of Daw Technologies, Inc. labeled "simplicity," (undated), one page.
Advertisement of Clean Air Technology, Inc., Jul.-/Aug. 1990, 1 page.

(List continued on next page.)

Primary Examiner—Harold Joyce
Attorney, Agent, or Firm—Kilpatrick & Cody

[57] ABSTRACT

An environmental control systems including a modular isolation chamber is disclosed. Together with associated atmospheric regulatory equipment, the connectable modular chambers provide a smaller, cost-effective alternative to the traditional clean rooms utilized for fabricating or processing semiconductors and other products. Because the work pieces and processing or other machinery are isolated from the remainder of the rooms in which they are located, decontamination of much of each room is not required. Use of the portable, modular chambers of the present invention also permits increased control over particulate contaminates smaller than heretofore satisfactorily regulated and individualized regulation of differing processing environments within a single room.

20 Claims, 18 Drawing Sheets

OTHER PUBLICATIONS

Article entitled "Eliminating the Cleanroom: Experiences with an Open-Area SMIF Isoloation Site (Oasis)," Randall A. Hughes, Bizhan Moslehi, Ph.D., and Egil D. Castrel, Ph.D., *Microcontamination*, Apr. 1988, pp. 31–37.

Article entitled "SMIF Technology Reduces Clean Room Requirements," Mihir Parikh and Anthony C. Bonara, reprinted from *Semiconductor International*, May 1985 issue, 6 pages.

Article entitled "SMIF: A Technology for Water Cassette Transfer in VLSI Manufacturing," Mihir Parikh and Ulrich Kaempf, reprinted from *Solid State Technology* ©*Jul. 1984, 4 pages.*

Promotional literature entitled "Asyst Technologies," (undated), 11 pages.

Promotional literature entitled "Asyst-SMIF System," (undated), 10 pages.

Promotional literature entitled "Control Humidity Constancy to ±0.5%" of Parameter Generation and Control, Inc. (undated), 28 pages.

Promotional literature of Isoflow Technology Corporation, (undated), 8 pages.

Paper entitled "Ultra-Clean Process Enclosures for Airborne Contamination Control", Paul W. Smith, (undated), 15 pages.

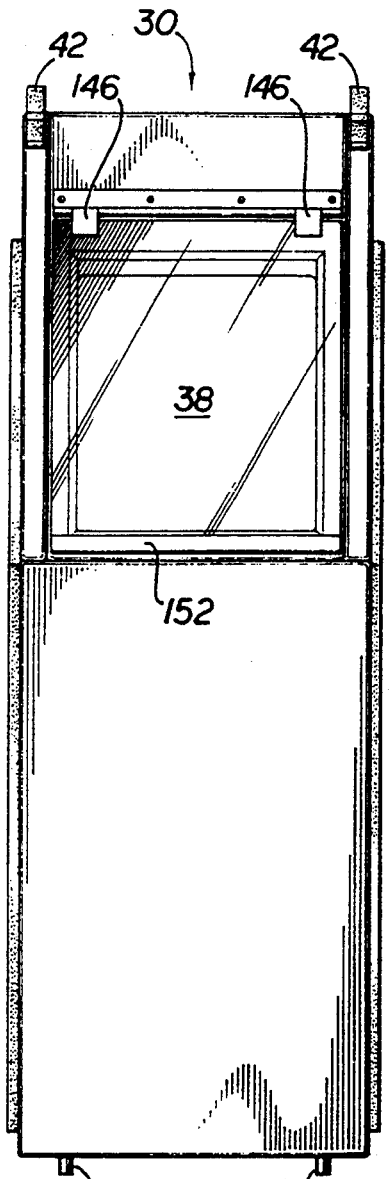
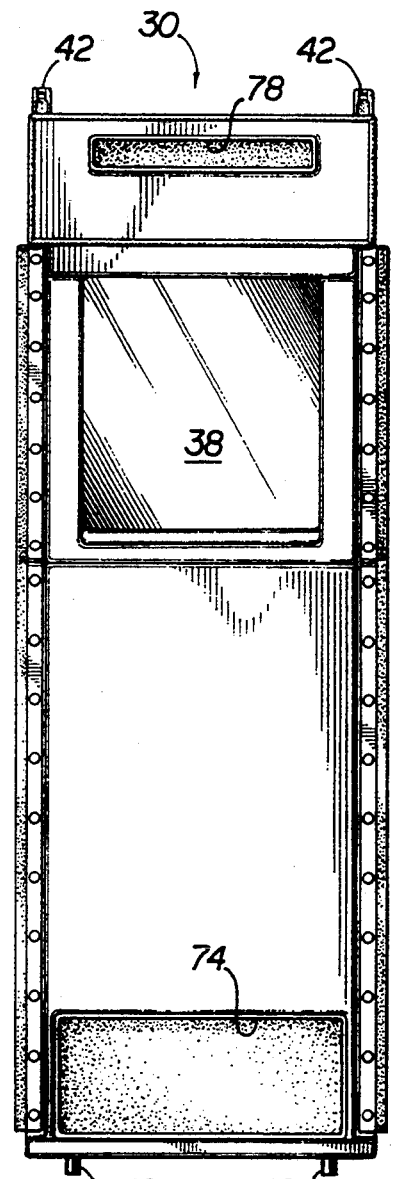
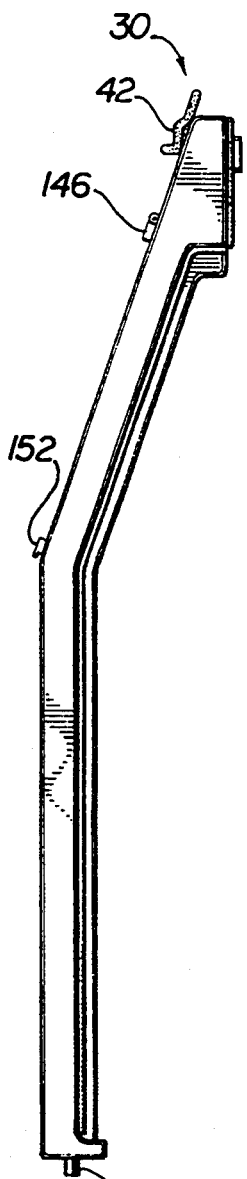
FIG 5  FIG 6  FIG 7
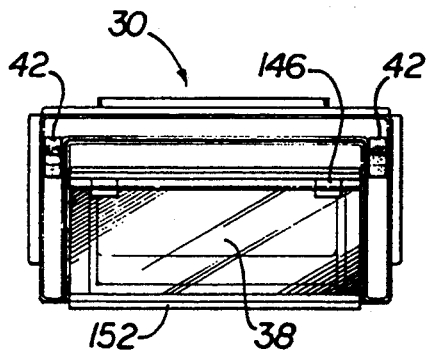
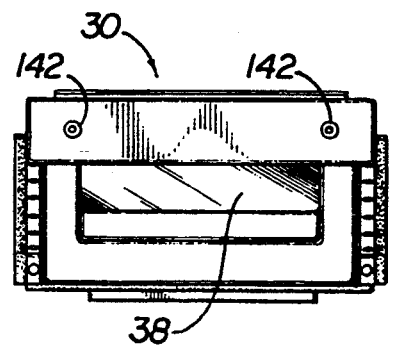
FIG 8  FIG 9

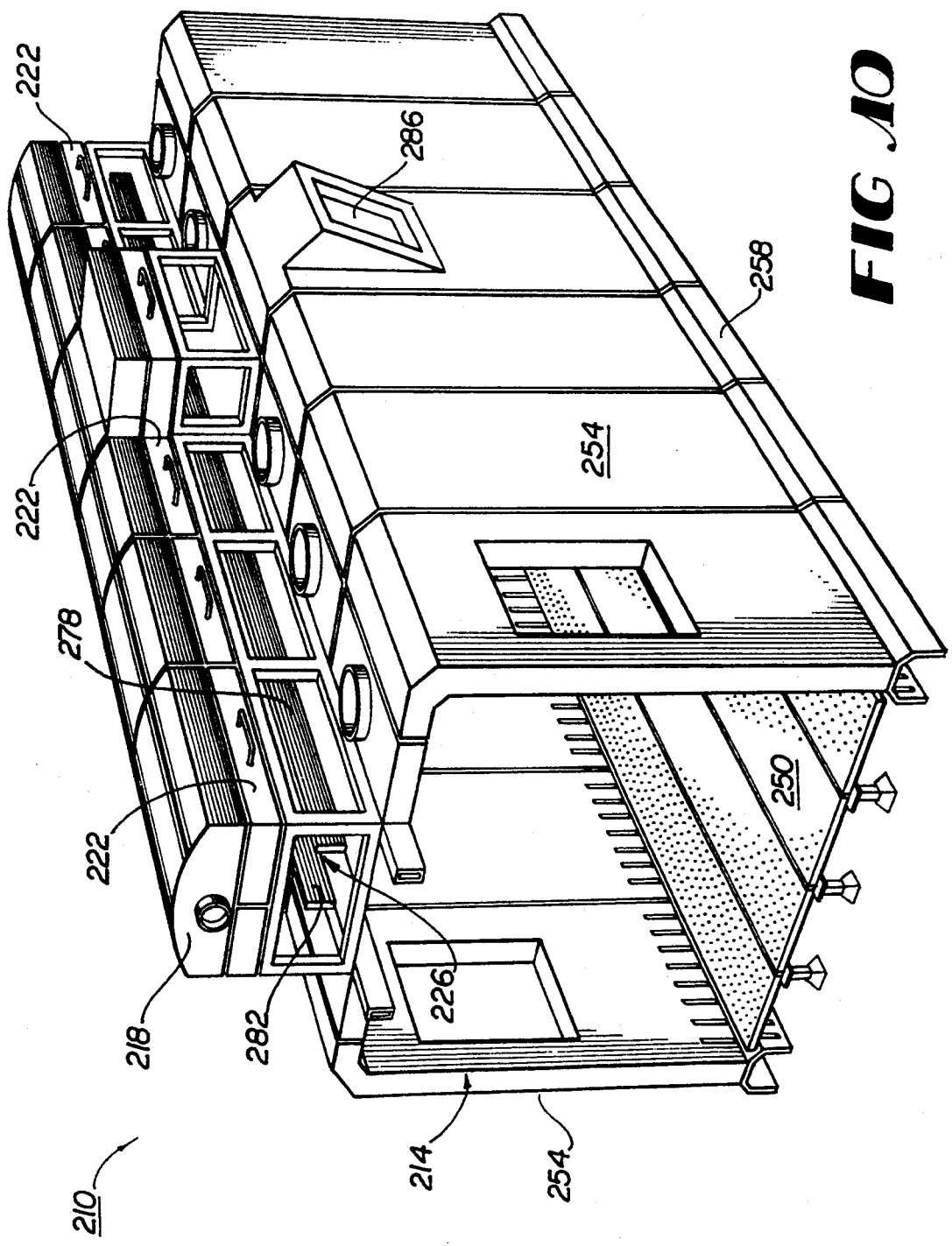

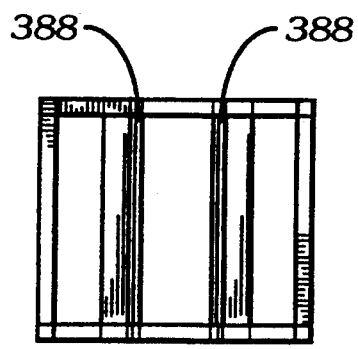
FIG 19C
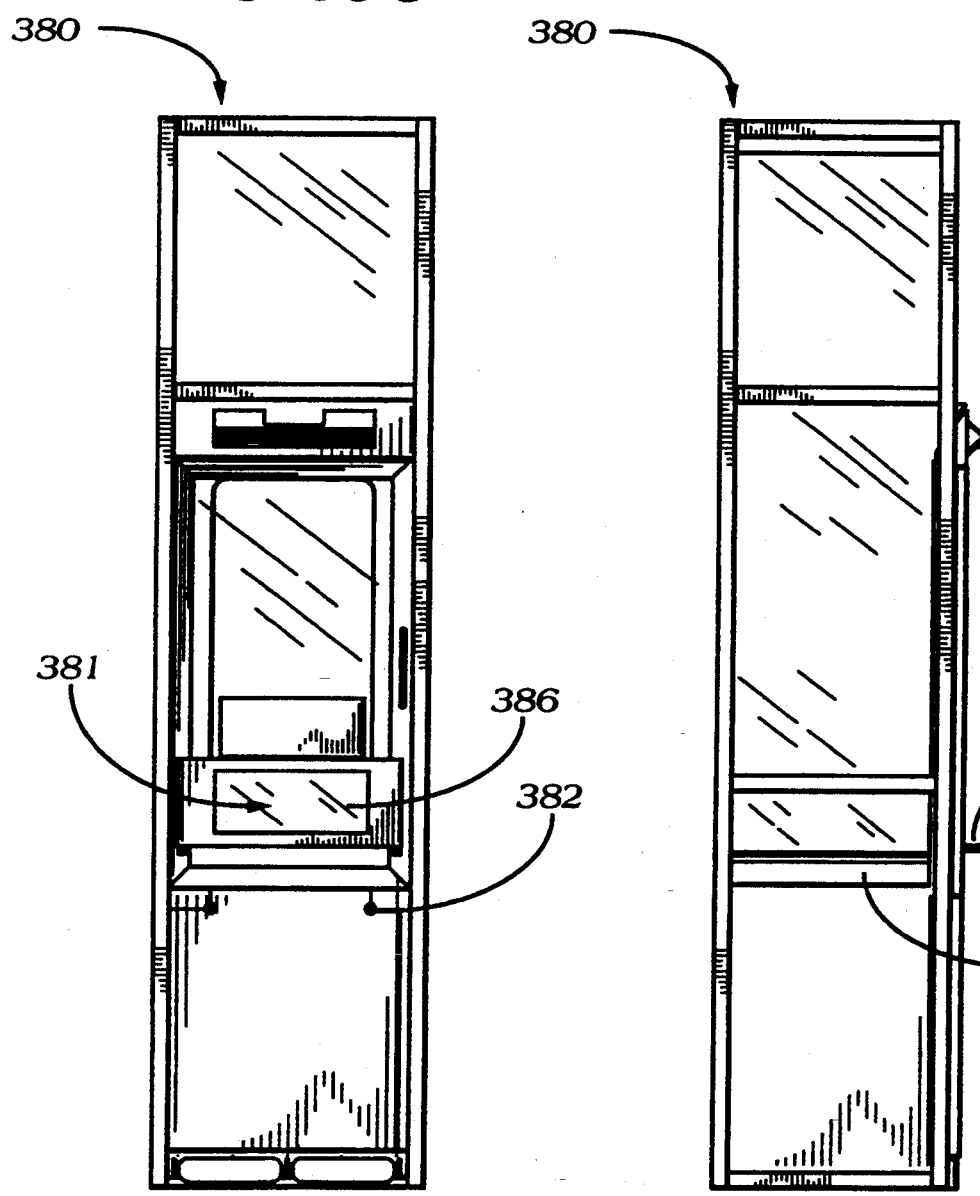
FIG 19A  FIG 19B

ENVIRONMENTAL CONTROL SYSTEM

CROSS-REFERENCE TO RELATED APPLICATIONS

This application is a continuation in part of application Ser. No. 08/010,534, filed Jan. 28, 1993, having the same title, now abandoned, which is a continuation in part of application Ser. No. 07/688,645 (U.S. Pat. No. 5,195,922), filed Apr. 19, 1991, having the same title, which is a continuation in part of application Ser. No. 07/574,970 (U.S. Pat. No. D331,117), filed Aug. 29, 1990, entitled "An Aperture," which applications are incorporated herein in their entireties by this reference.

FIELD OF THE INVENTION

This invention relates to environmental control systems and more particularly to enclosures for regulating atmospheric conditions in areas surrounding, e.g., processing equipment and in material transportation and handling aisles and systems used or useful in a variety of industries.

BACKGROUND OF THE INVENTION

Fabricating semiconductors chips is a multi-step process. Silicon wafers, sliced from a crystal ingot, initially are lapped flat and polished to a mirror-like finish. A layer of single crystalline silicon subsequently is grown on each wafer and the wafers oxidized at elevated temperatures approaching 1000° C. A light-sensitive, "photo-resist" coating then may be applied to each wafer and a wafer stepper used to expose the photo-resist coating. Exposing the coating produces multiple prints containing images of several integrated chips on each wafer.

Following exposure, the photo-resist coatings are developed and baked to harden the patterned prints onto the silicon wafers. The wafers then contact a reactive gas discharge, etching exposed portions of the wafers, before having ionized boron atoms or other impurities implanted into the patterns. A low temperature (350° C.) plasma discharge deposits silicon dioxide on the wafers at low pressure, while circuit component contacts may be made by depositing onto the wafers a thin aluminum or similar metallic film. Each wafer later may be cut into multiple semiconductor chips using a precision diamond saw and the chips attached to packages having contact leads and wire connections. Finally, each chip is then encapsulated in plastic for mechanical and environmental protection.

Because even microscopic airborne impurities can degrade the quality and yield of the fabricated chips, many of these manufacturing steps, including those of applying the photo-resist coating to the wafers and exposing integrated chip images on the coatings, are performed in facilities called "clean rooms." The atmospheres of these clean rooms generally are regulated to limit the numbers and types of particles capable of contacting the silicon wafers. Bodies of workers operating in clean rooms, for example, typically are enveloped by sterile clothing to prevent skin, hair, and other personal particulate matter from being deposited on the wafers. Additional Humidity/Ventilation/Air Conditioning (HVAC) equipment may be used to condition air within the clean rooms to reduce particle concentrations resulting from other sources of contamination such as the wafer processing and handling machinery.

An average manufacturing facility may include as many as two hundred pieces of processing and handling equipment for fabricating semiconductor chips. To accommodate both the various equipment used to process the wafers and wafer-handling personnel, the size of many clean rooms frequently may approach 20,000 ft$^2$. Such rooms are costly to construct, requiring sophisticated monitoring and air conditioning equipment to regulate, even moderately, the large-scale environments. Moreover, although clean rooms may be erected to meet present governmental and industry standards mandating less than or equal to 7.5 particles of 0.2 microns or larger per cubic foot, many do not, and cannot, be constructed to fulfill the more rigorous decontamination standards required to produce, for example, 64-megabit dynamic random-access memory chips (DRAMs). Existing clean room technology similarly cannot protect work pieces and material-handling personnel from many microscopic contaminates, including bacteria and viruses, present in the medical, pharmaceutical, biotechnological, food preparation, aerospace, and other processing industries.

SUMMARY OF THE INVENTION

The present invention provides a series of modular, connectable isolation chambers and associated atmospheric control equipment as an alternative to the traditional clean room. Use of these portable, modular chambers, into which specific pieces of semiconductor or other processing machinery or material transportation and handling equipment may be placed as desired, permits increased control over organic and inorganic particulate contaminates at least as small as 0.12 microns while reducing the cost associated with maintaining multiple suitable environments for processing to occur. Because the work pieces and machinery are isolated from the remainder of the rooms in which they are located, decontamination of much of each room is not required. Similarly, isolating the work pieces and equipment from human operating personnel eliminates the need for workers to wear protective clothing, potentially improving health and safety conditions. The connectable nature of the portable chambers also permits easy rearrangement when equipment or other requirements change.

In one closed-loop embodiment of the invention, air or other fluid flowing in laminar fashion over the processing equipment may be recirculated through airtight cover ducts such as those illustrated in co-pending application Ser. No. 07/574,970. The cover ducts also allow access to the interiors of the chambers for servicing and maintaining the equipment as required. The invention includes sensors and regulating equipment designed to maintain constant (positive) pressure within the chambers, preventing contaminated air or other fluid from entering through an opened cover duct or other access means during product loading or servicing. Filtration systems and particle sensors also are included to monitor and reduce particular contaminates present within each module, while temperature and humidity sensors provide information concerning these variables to the HVAC equipment or an operator control display. Precisely controlling the pressure, temperature, and humidity within each chamber helps prevent, for example, unwanted thermal expansion of the products or misalignment of sensitive equipment and undesired changes in the viscosity of the photo-resist coating. If one or multiple modules are utilized, a unitary damper also may be included to supply "make up" air or other fluid to the common HVAC equipment as necessary. Various lips, skirts, and flanges permit virtually any number of individual modules to be connected and sealed, minimizing wasted space in enclosing differing quantities of processing or other equipment.

In addition to the airtight, cover ducts, the recirculatory system of the present invention includes a molded plenum for isolating supply air or other fluid from exhaust returning through the cover ducts and a filter housing into which a replaceable fiberglass ULPA or other filter is positioned. Following replacement of the filter, a compressive, inflatable seal may be used to seat the filter into the housing, thereby forcing the supply air or fluid through the filter before contacting the wafer processing or other equipment. A nozzle formed in each cover duct funnels exhaust through suitable piping and dampers, returning it to the HVAC equipment for reuse.

It is therefore an object of the present invention to provide a series of modular, connectable chambers for isolating work pieces and processing or other equipment from airborne contaminates.

It is an additional object of the present invention to provide a series of modular chambers which, when connected to associated atmospheric control equipment, function as an alternative to the traditional clean room.

It is another object of the present invention to provide increased control over particulate contaminates while reducing the cost associated with maintaining existing processing environments.

It is yet another object of the present invention to connect multiple isolation modules and permit easy rearrangement of the modules when processing equipment or other requirements change.

It is an additional object of the present invention to provide means for monitoring characteristics of and filtering, controlling, and recirculating the air or other fluids within the modular enclosures.

It is a further object of the present invention to provide means for individually regulating differing processing environments within the same room or facility.

Other objects, features, and advantages of the present invention will become apparent with reference to the remainder of the written portion and the drawings of this application.

BRIEF DESCRIPTION OF THE DRAWINGS

FIG. 5 is an exterior elevational view of a cover duct forming part of the modular isolation chamber of FIG. 2.

FIG. 6 is an interior elevational view of the cover duct of FIG. 5.

FIG. 7 is an end elevational view of the cover duct of FIG. 5.

FIG. 8 is a top plan view of the cover duct of FIG. 5.

FIG. 9 is a bottom plan view of the cover duct of FIG. 5.

FIG. 10 is a perspective view of a portion of an alternate modular isolation chamber of the present invention.

FIGS. 19A–C are front, side and top views of an input/output section of a modular chamber.

DETAILED DESCRIPTION

Figure 1:
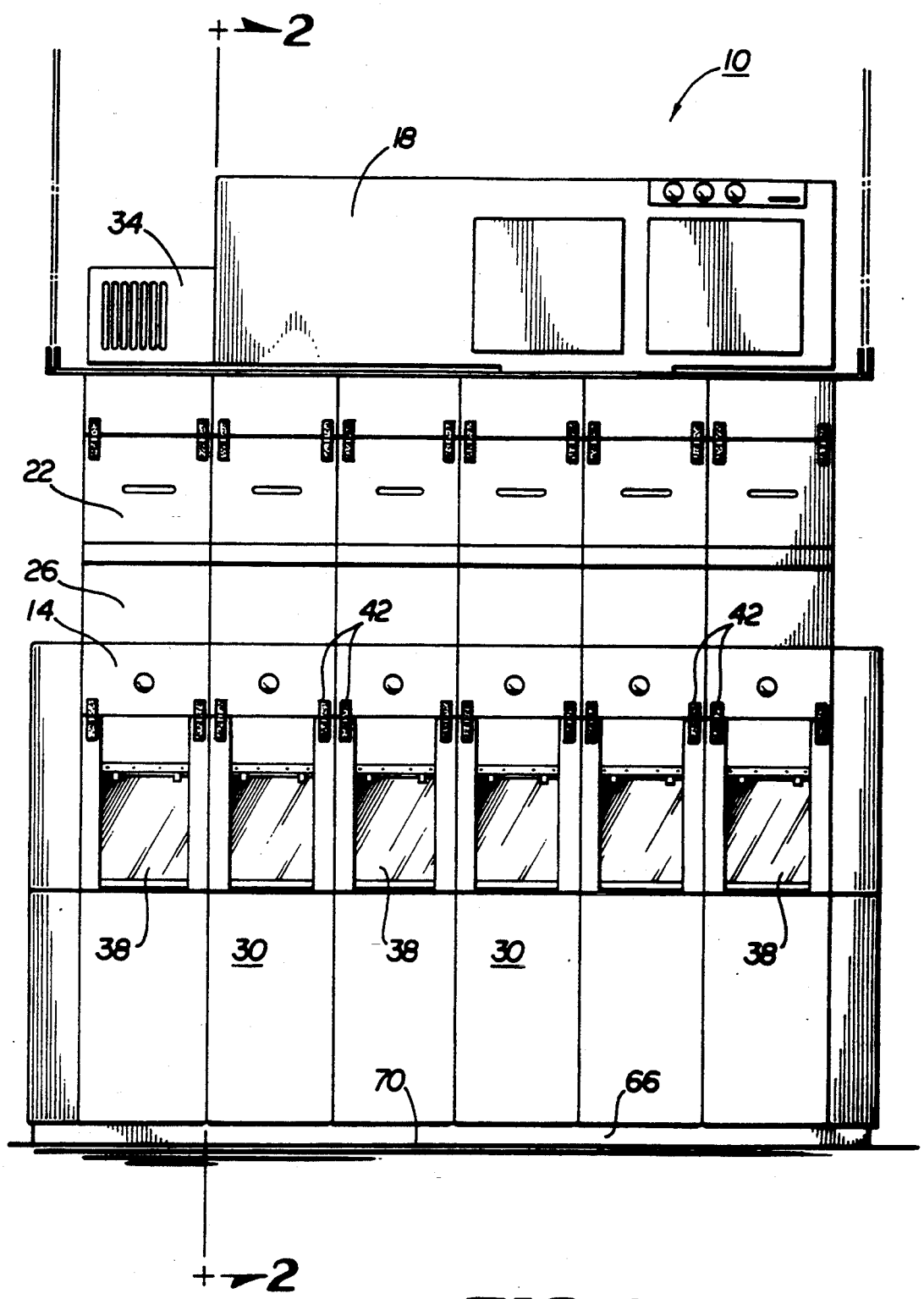
FIG. 1 is an elevational view of a series of modular isolation chambers of the present invention together with associated environmental control equipment.

FIG. 1 illustrates the environmental control system 10 of the present invention. Included in system 10 are one or more isolation chambers 14 as well as HVAC equipment 18, at least one CVF filter structure 22, and one or more supply ducts 26. Alternatively, existing clean rooms may be modified by connecting chambers 14 and other necessary components to any existing (compatible) central HVAC equipment, or to localized HVAC equipment such as products of Parameter Generation and Control, Inc., should any of this equipment already be in place. Modular chambers 14 enclose various processing or other machinery or equipment 28 (FIG. 2), protecting the machinery and work pieces from airborne contaminates while permitting variable environments to be created for differing equipment 28 types. Because equipment 28 is isolated from the remainder of any room in which it is located, decontamination of the remaining space in the room is optional and not required. Using chambers 14 also eliminates the need for workers to wear protective clothing unless accessing the interiors of the chambers 14 themselves.

Also shown in FIG. 1 are cover ducts 30 and a common "make up" air duct 34 for supplying uncirculated air or other fluid to HVAC equipment 18 when necessary or desired. At least one cover duct 30 is associated with each chamber 14 to permit servicing of equipment 28 located within the chamber 14. Cover duct 30 may include window 38 and latches 42 to permit easy access to the chamber 14 interior, either merely by opening window 38 or by removing the cover duct 30 itself. Latches 42 similarly permit cover duct 30 to remain closed when equipment 28 operates.

Figure 2:
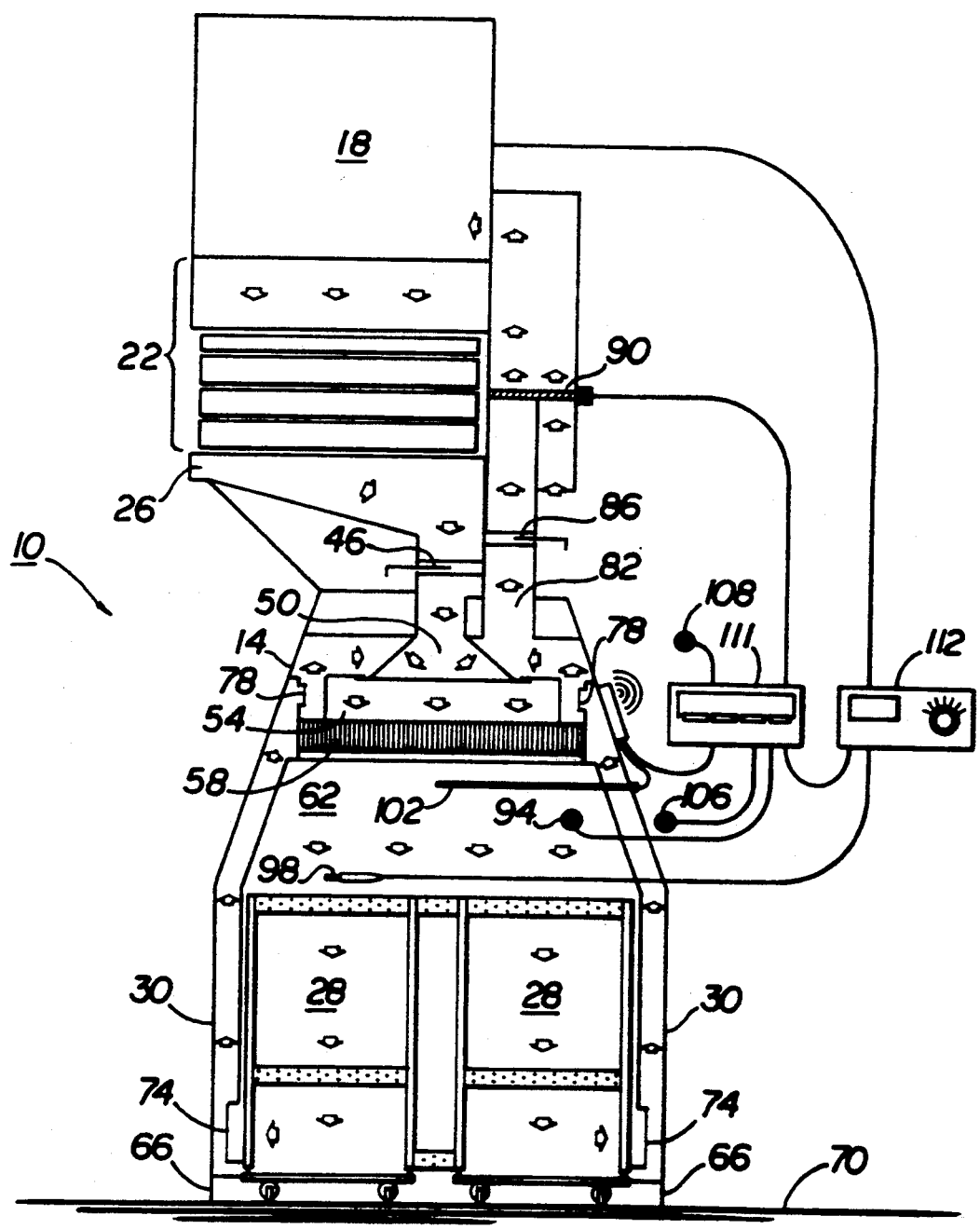
FIG. 2 is a cross-sectional, partially schematicized view of a modular isolation chamber and associated controls taken principally along lines 2—2 of FIG. 1.

The arrows shown in FIG. 2 illustrate the recirculating fluid flow of system 10. In an embodiment of system 10 consistent with FIG. 2, air or other fluid pressurized and conditioned by HVAC equipment 18 flows through CVF filter structure 22 into supply duct 26. If supply damper 46 is open, the fluid flows through supply duct 26 into plenum 50 and then into housing 54, which contains particulate filter 58. The twice-filtered fluid subsequently travels into the interior 62 of chamber 14, where it flows in laminar fashion over (and, if desired, through and around) equipment 28, permitting continued operation of the equipment 28 and removing particles which might otherwise contact the silicon wafers or other work pieces being processed or acted upon by equipment 28. As shown in FIGS. 1-2, chamber 14 may have a skirt 66 for sealing it to the floor 70, thereby precluding fluid entry or exit which otherwise could occur. If a non-recirculating, single-pass system is preferred, skirts 66 may be removed to allow egress of the pressurized air or other fluid. Skirts 66 or other suitable means may also be used to retain in place the frame 72 containing equipment 28.

After contacting and removing particles from equipment 28 (and assuming skirts 66 are utilized), the fluid—now exhaust—flows into lower openings 74 of cover ducts 30. Cover ducts 30, which are hollow (see also FIGS. 3 and 6), permit the exhaust to travel through them to their upper openings or nozzles 78. Nozzles 78 funnel the exhaust into areas of chamber 14 isolated from filter 58 and equipment 28 and through exhaust duct 82 for reentry into HVAC equipment 18. Exhaust damper 86 may be used to prevent exhaust from reentering HVAC equipment 18 (and thereby set the level of positive pressure in chamber 14 or, in certain circumstances, adjust and maintain the positive pressure, as when window 38 is open or cover duct 30 is removed). Unitary make-up damper 90, also shown in FIG. 2 and connected to make up duct 34, may be used as an alternative pressure control and to supply a constant quantity of air or other fluid to HVAC equipment 18 when, for example, window 38 is open or one or more of exhaust dampers 86 are closed.

FIG. 2 further illustrates some of the monitoring and control equipment associated with system 10. Included within interior 62 of chamber 14 may be sensors 94, 98, and 102 for sensing, respectively, the pressure, temperature and humidity, and number of particles present in the supply air or fluid entering chamber 14. An external pressure sensor 106 and ambient temperature and humidity sensor 108 may be located outside chamber 14, permitting determination of the pressure, temperature, and humidity differentials within and without the chamber 14. Each of sensors 94, 98, 102, 106, and 108 may be connected to one or both of controls 111 and 112.

As detailed in FIG. 2, control 112 is connected to HVAC equipment 18 and is capable of varying the velocity of the conditioned supply air or other fluid exiting the HVAC equipment 18 in response to information obtained from one or more of sensors 94, 98, 102, 106, and 108. Control 111, which may be used to open or close any or all of dampers 46, 86, and 90, functions to balance the supply and exhaust air or other fluid flowing through system 10 and thereby maintain constant (or other desired) pressure within each chamber 14. As noted earlier, maintaining a constant positive pressure within a chamber 14 is useful in preventing unfiltered air or other fluid from entering through an open cover duct 30 or window 38 when, for example, processing equipment 28 is serviced. In various embodiments of system 10 either or both of controls 111 and 112 may be or include conventional computers capable of displaying conditions within chamber 14 and providing alarms, data logging, and other functions as appropriate or desired. Controls 111 and 112 also may be used to create unique environments within each chamber 14 of a multi-chambered system 10 as required by the corresponding types of equipment 28 enclosed.

Figure 3:
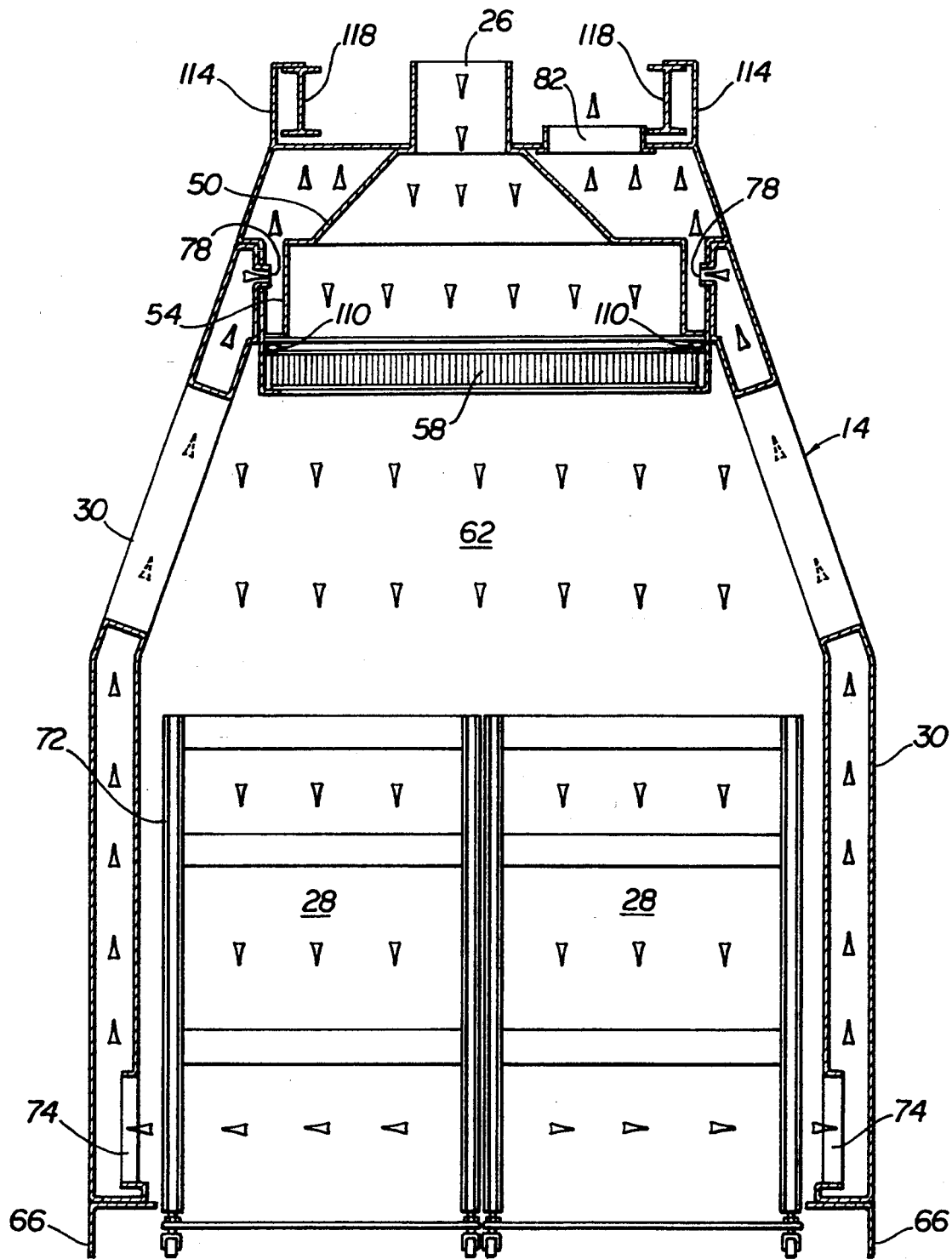
FIG. 3 is an expanded cross-sectional view of the modular isolation chamber of FIG. 2.

Additional detail concerning chamber 14 and associated equipment is provided in FIG. 3. Included in FIG. 3 are seal 110, lips 114, and beams 118. Seal 110, which may be made of inflatable rubber or similar material, engages the upper periphery of filter 58 and compressively seats (and seals) the filter 58 within housing 54. Together with plenum 50 (which may be molded to have an inverted funnel shape), filter 58, seal 110, and housing 54 isolate the supply air or other fluid entering through supply duct 26 from the exhaust exiting nozzles 78. Moreover, because seal 110 is inflatable, sufficient space within housing 54 can be created to remove filter 58 (should it need to be evaluated or replaced) merely by deflating the seal 110. To prevent unwanted contamination of the interior 62 of chamber 14, the inflation stem of seal 110 may be positioned in the exhaust area of chamber 14 isolated from the supply air or other fluid. Lips 114 permit each chamber 14 to slide onto and attach to a pair of horizontally-positioned "I"-shaped (or similar) beams or supports 118, allowing multiple chambers 14 to be connected in series as detailed in FIG. 1. Various "T"-shaped or other sealing or fastening devices may be used to seal the peripheries of adjoining chambers 14 and create an essentially unitary structure for enclosing clusters of compatible equipment 28. As is readily apparent, addition, deletion, and rearrangement of chambers 14 may occur merely by sliding the modular chambers 14 on and off supports 118.

Figure 4:
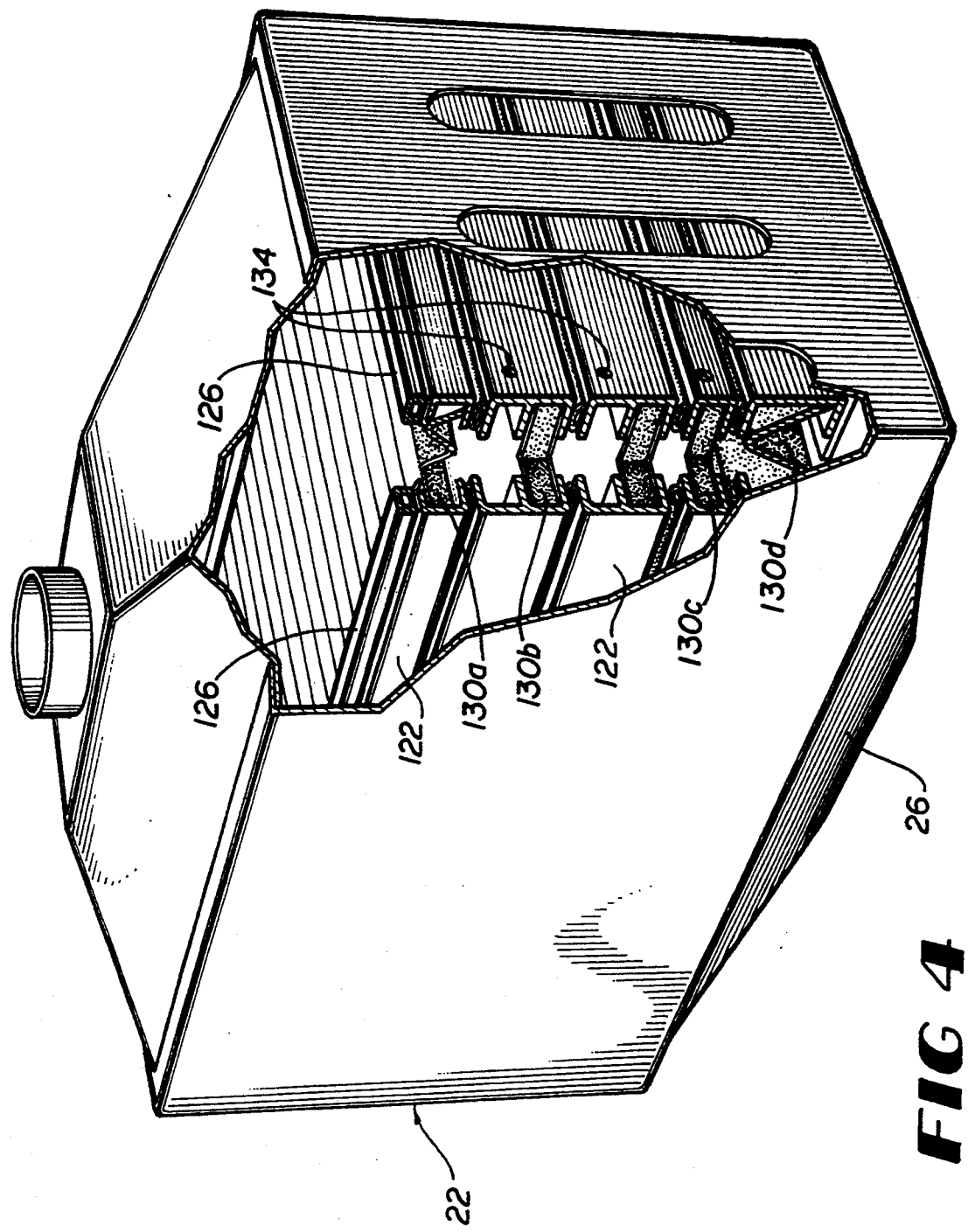
FIG. 4 is a perspective, partially sectioned view of a chemical vapor filtration (CVF) system forming part of the environmental control equipment of FIG. 1.

FIG. 4 details a typical CVF filtration structure 22 of system 10. Included in filtration structure 22 are frame 122, seal 126, and one or more filters 130a–n. Frame 122, which may be tiered to accommodate multiple filters 130, may have its upper periphery sealed to structure 22 by seal 126 which, like seal 110, can be inflated for easy placement and removal of the filters 130. Frame 122 and structure 22 also may contain ports 134 to allow probes to sample air or other fluid passing through various filters 130. Also illustrated in FIG. 4 is an upper port 138 for conditioned air or other fluid to enter structure 22 from HVAC equipment 18. A lower port (not shown) permits the fluid to exit structure 22 into supply duct 26.

In at least one embodiment of system 10, structure 22 contains four spaced filters 130, a one-inch thick fiberglass ASHRAE filter (130a), two one-inch thick activated charcoal filters (130b and 130c), and a two-inch thick fiberglass ASHRAE filter (130d), positioned from top to bottom within structure 22. These filters 130, while trapping certain particles, also absorb organic and other chemicals which might otherwise pass through filter 58 (which typically is a fiberglass ULPA or similar filter or may be an Ultra Filter provided by Y Square Ltd. of San Clemente, Calif.). The lowermost ASHRAE filter 130d additionally can be used to trap and thereby prevent any charcoal particles from exiting structure 22. Referring to FIG. 1, filters 130 may be placed in a openable drawer forming part of structure 22 if desired to facilitate filter 130 access and replacement.

FIGS. 5–9, which correspond to FIGS. 2–6 of Ser. No. 07/574,970, illustrate cover duct 30 of system 10. As seen from its exterior (FIG. 5) and discussed earlier, cover duct 30 includes window 38 and latches 42 for permitting access to equipment 28 and easy attachment and detachment of the cover duct 30 to and from chamber 14. Feet 142 are designed to engage corresponding plates in chamber 14, helping to seal cover duct 30 to the chamber 14 when in place. Gasket 146, which contacts the exterior of chamber 14, similarly helps seal cover duct 30 to the chamber 14. Hinges 150 and handle 152 (FIG. 7) allow window 38 to be opened and closed from outside Chamber 14, and cover duct 30 may be made of lightweight plastic for ease of handling when removed from chamber 14.

FIG. 6 provides additional detail concerning the fluid recirculation function performed by cover duct 30. As noted earlier, lower opening 74 serves to intake exhaust which has passed over equipment 28. The pressurized exhaust then is conveyed through the hollow interior of cover duct 30 to nozzle 78, from which it may be passed to suitable piping such as exhaust duct 82 and subsequently reused. If recirculation is not desired, however, either or both of lower opening 74 and nozzle 78 may be occluded. Fasteners 154 illustrated in FIG. 6 secure gasket 146 to cover duct 30.

Because operating costs can be decreased by conditioning lesser quantities of air or other fluid, the dimensions of chamber 14 and other components of system 10 relative to the size of a traditional clean room form one of many important features of the present invention. In marked contrast to existing clean rooms, for example, selected embodiments of chamber 14 may be as small as (or on the order of) 52"×19"×70". FIGS. 2-3 illustrate an embodiment of chamber 14 sufficiently long to accommodate two adjacent pieces of equipment 28. Because each chamber 14 of the selected embodiments may be as narrow as 19" in width, determination of the number of chambers needed to enclose a series or cluster of equipment may be made relatively precisely, resulting in minimal or no wasted space. The substantially A-shaped exterior of chamber 14 shown in FIGS. 2-3 further decreases the unused space within chamber interior 62 while not obstructing the flow of fluid.

Unlike existing clean room technology, the decontamination capability of system 10 of the present invention is designed to meet or exceed Class 1 requirements of Federal Standard 209D for "Clean Room and Work Station Requirements, Controlled Environment" (Jun. 15, 1988), which standard is incorporated herein in its entirety by this reference, providing less than 7.5 particles per square foot of size greater than or equal to 0.16 microns. System 10 also can regulate particle contaminates as small as 0.12 microns, making it suitable for use in a variety of industries (including medical, pharmaceutical, biotechnological, food preparation, aerospace, and other industries) in addition to that of semiconductor fabrication. Other relevant parameters for which an embodiment of system 10 meeting Class 1 specifications is designed include:

| | |
|---|---|
| Air velocity | 50–135 ft/min |
| Filter 58 efficiency | 99.9997% |
| Filters 130 efficiency | 99.99% |
| Relative Humidity | 35–65% RH |
| Control Constancy | +1% RH |
| Temperature | 20–26° C. |
| Control Constancy | +.10° C. |
| Pressure | 0.05"–0.23" + 0.05" $H_2O$ Ga. |
| Sound Level | 65 dBa at 5 ft (average) |

Figure 11:
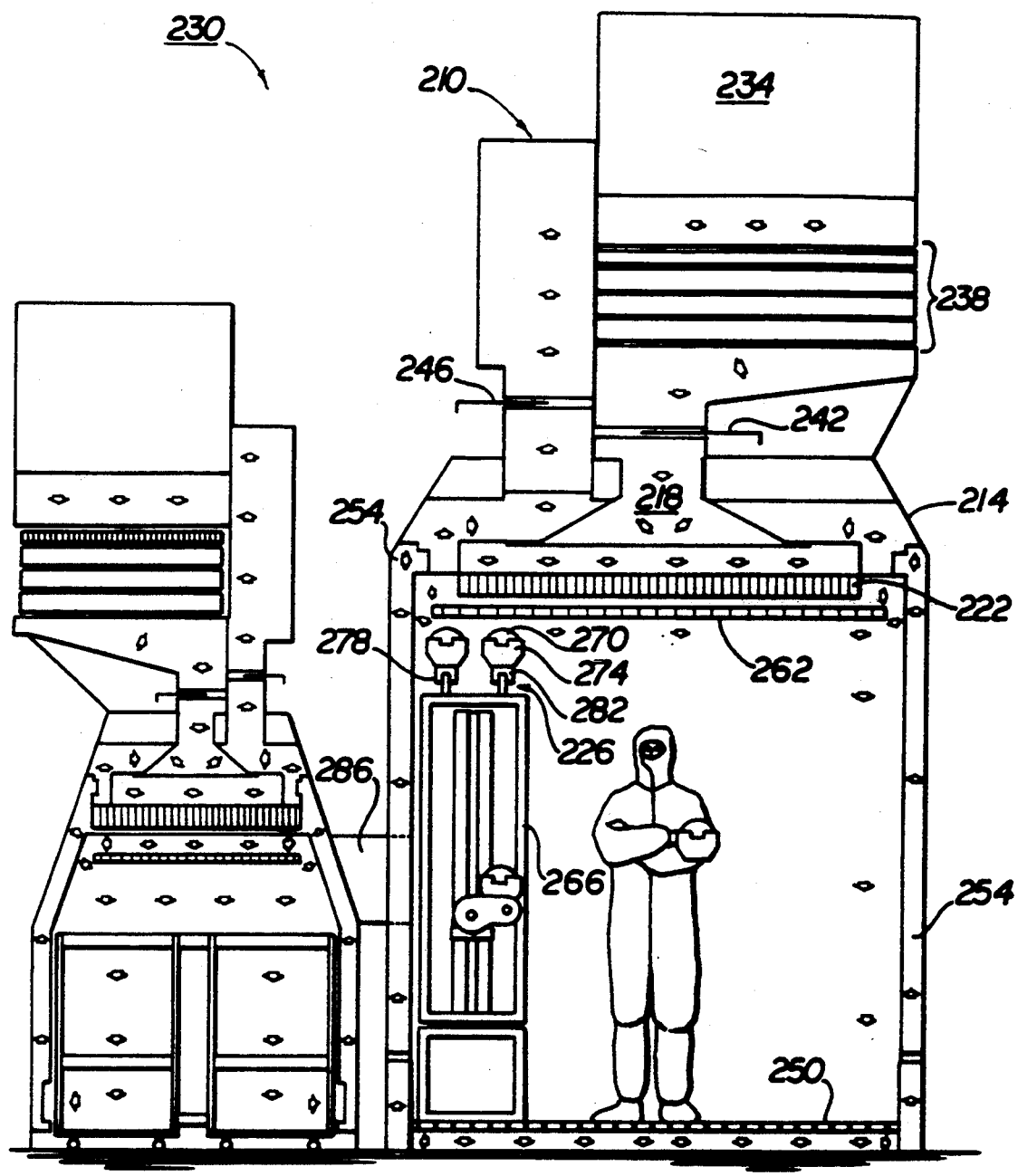
FIG. 11 is a cross-sectional view of the alternate chamber of FIG. 10, together with associated environmental control equipment, shown connected to the chamber of FIG. 2.
Figure 12:
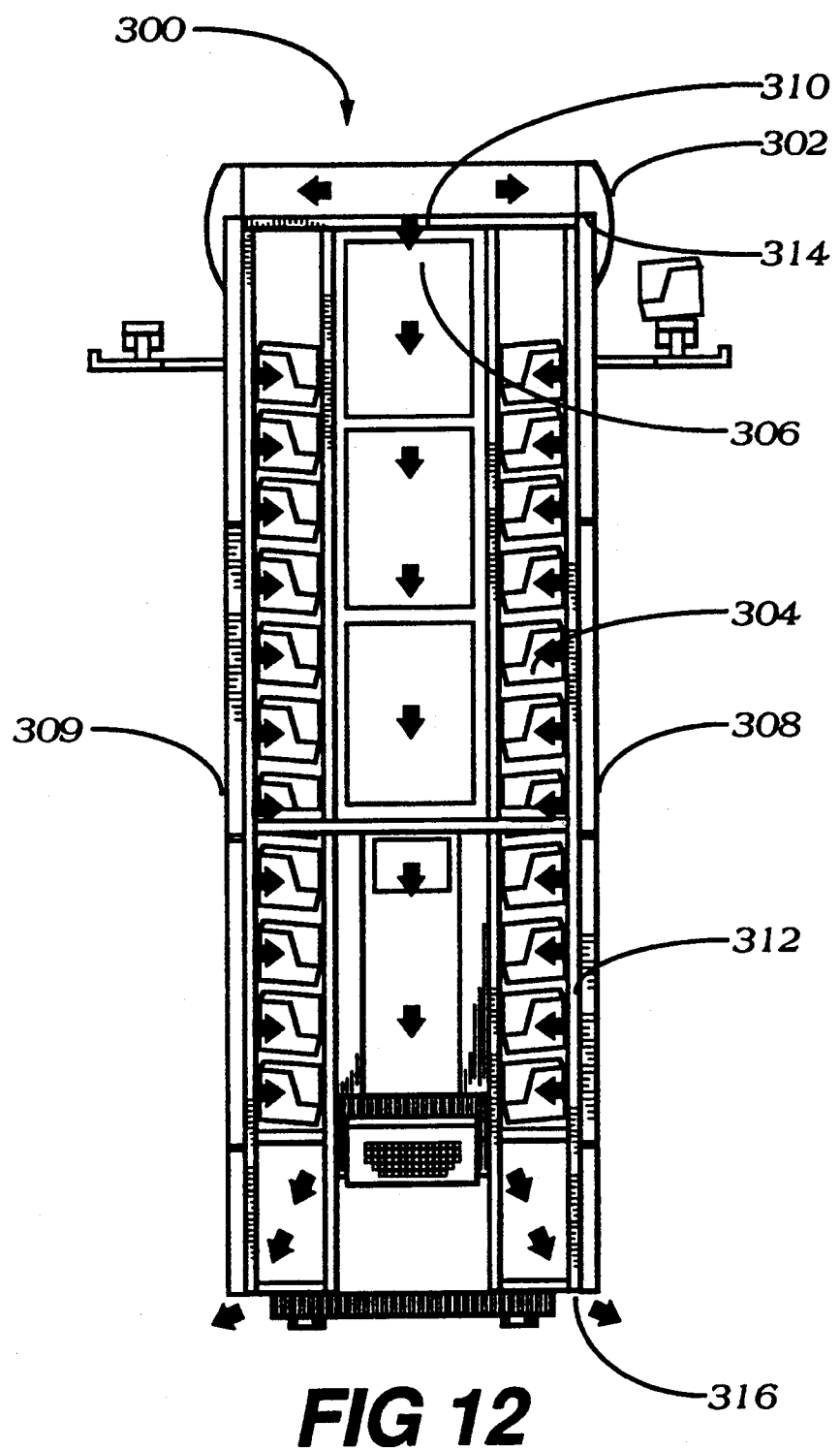
FIG. 12 is a front cross-sectional view of a mixflow modular isolation chamber.
Figure 13:
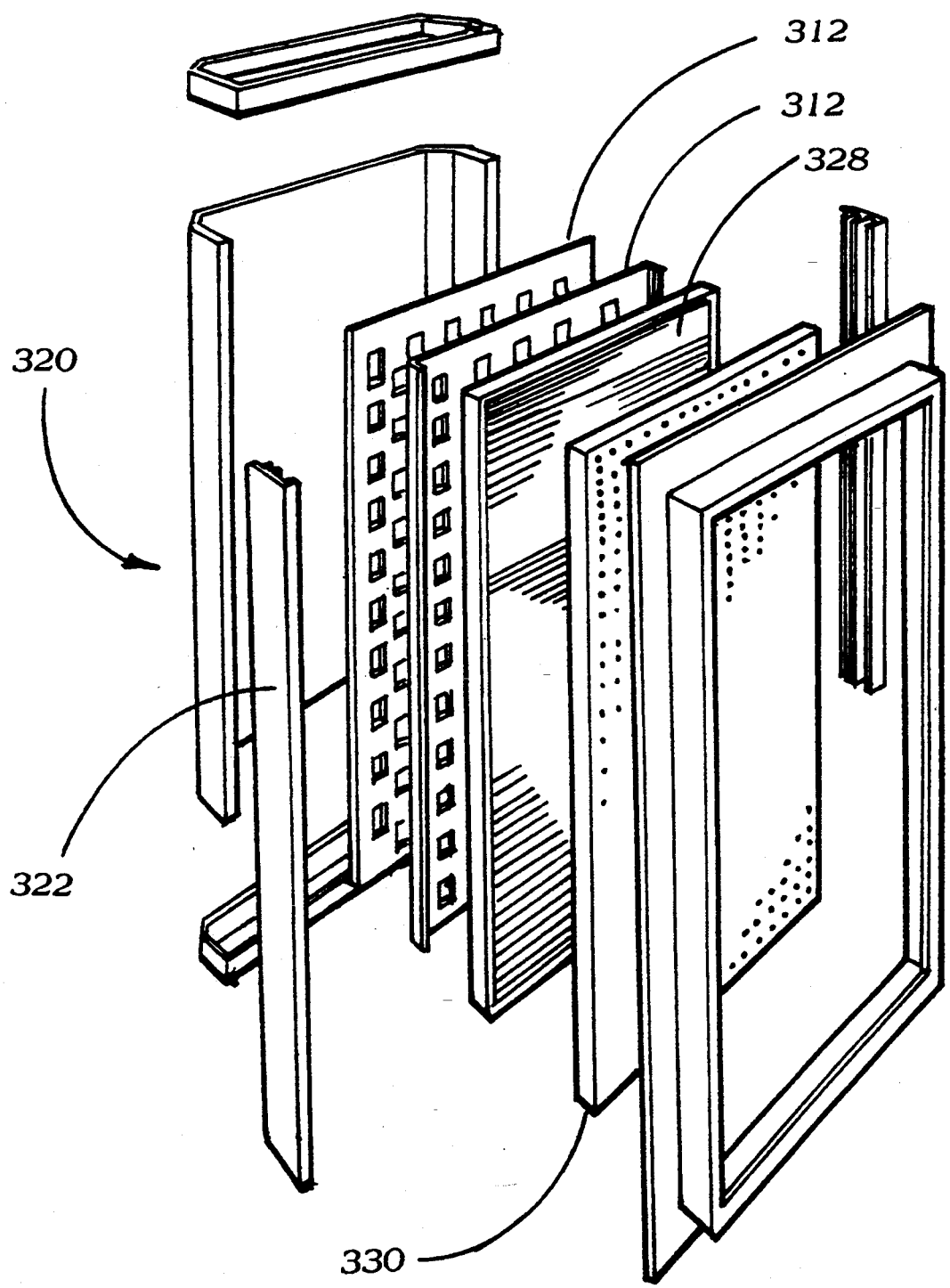
FIG. 13 is an exploded perspective view of a side panel forming part of the mixflow modular chamber of FIG. 12.
Figures 14A, 14B:
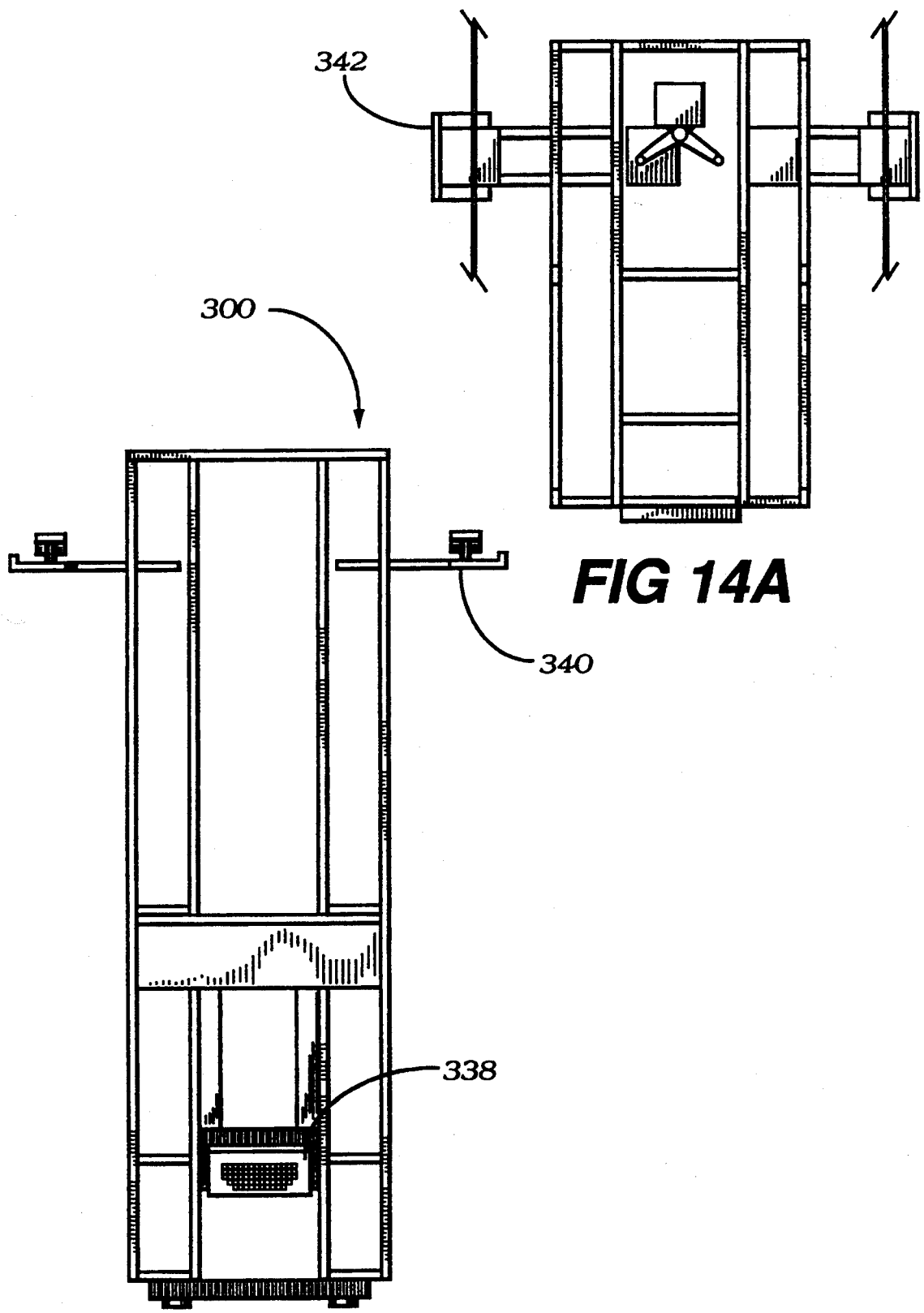
FIGS. 14A–C are top, front and side views, respectively of the mixflow modular chamber.
Figure 14C:
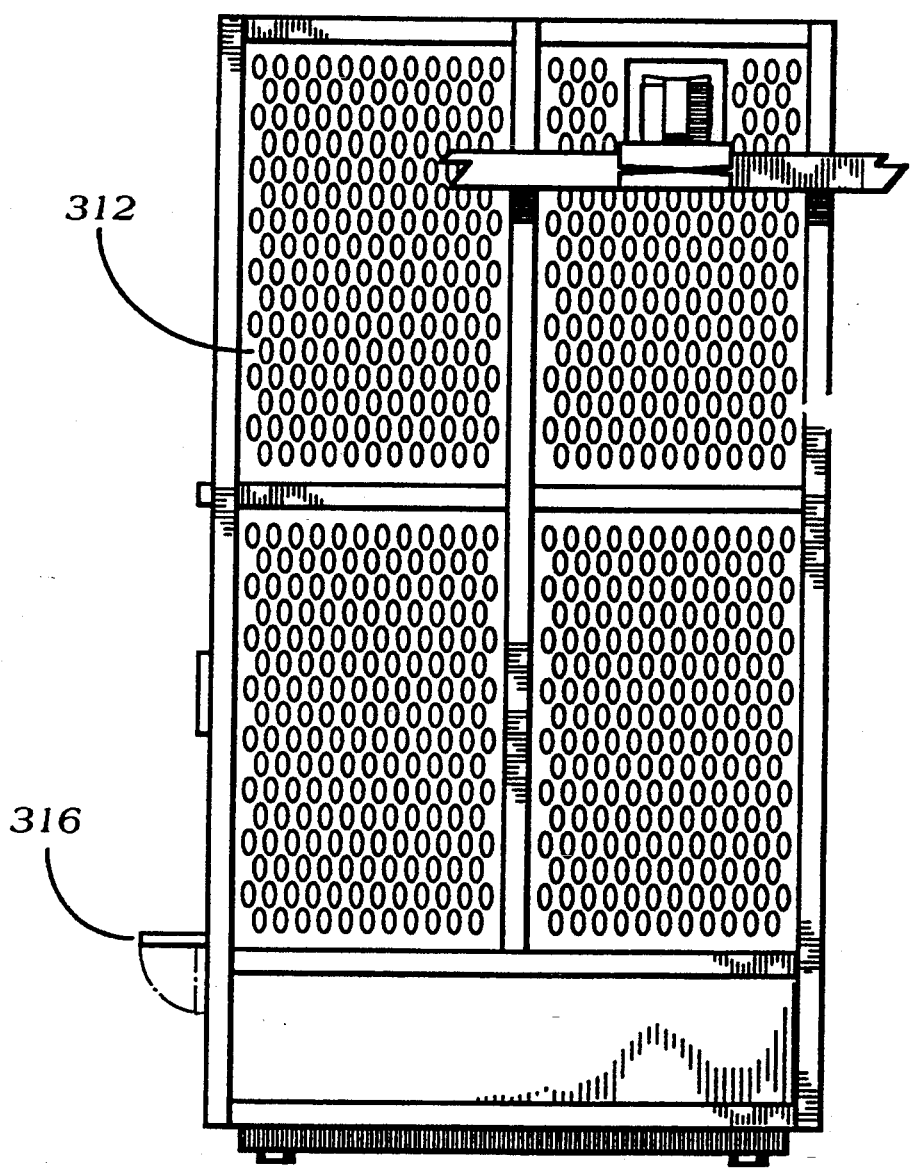
Figure 15:
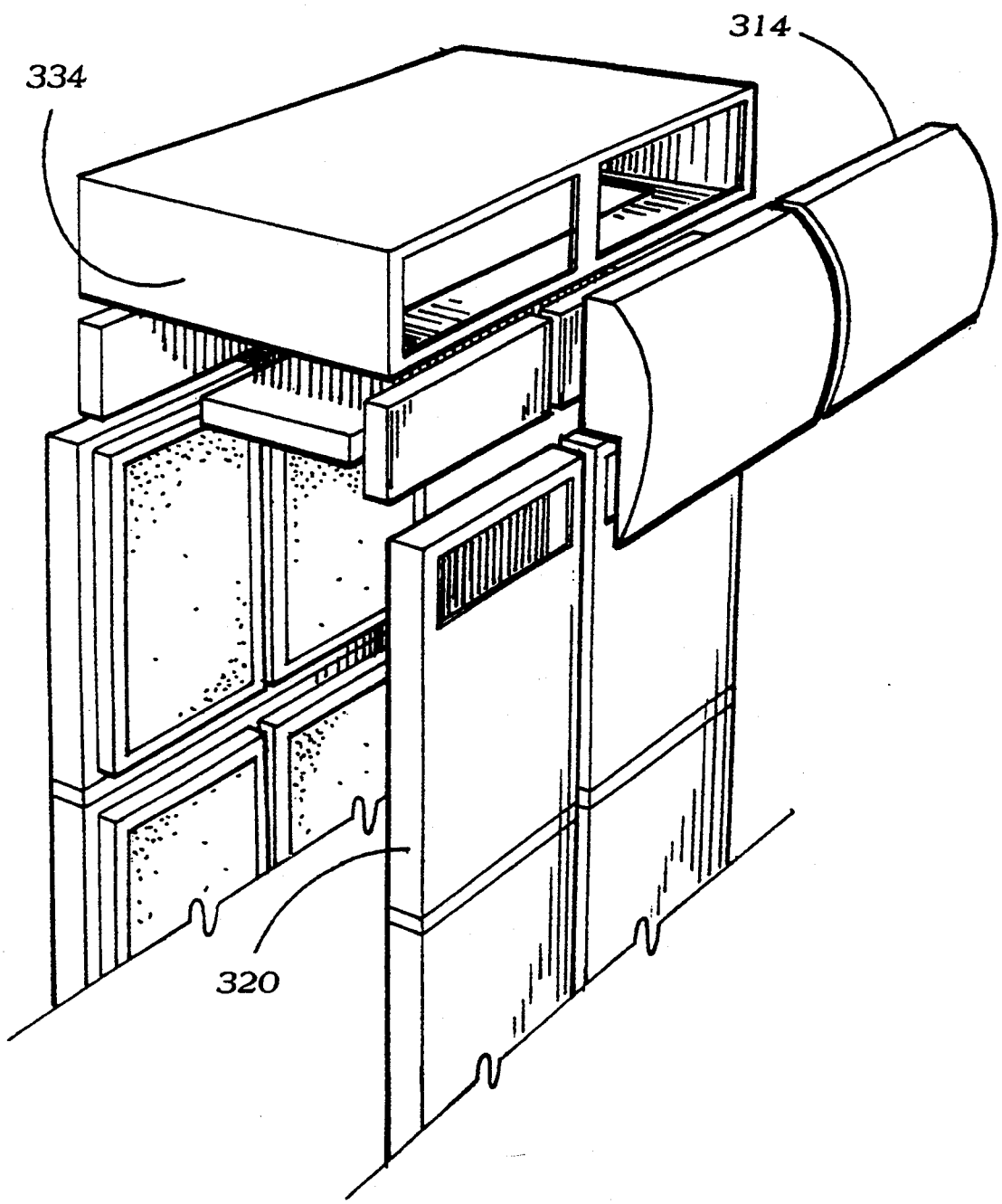
FIG. 15 is a perspective view of the mixflow modular chamber with a cover duct and transition baffles.
Figure 16B:
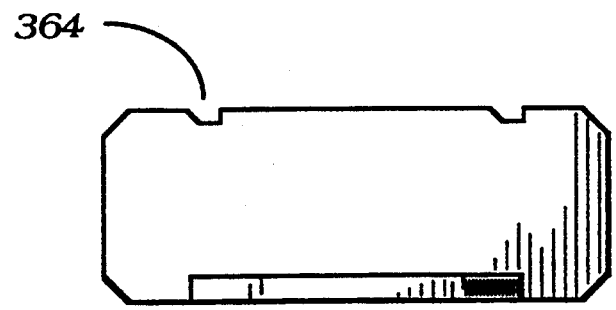
FIGS. 16A–D are top, side and rear views of a cassette for carrying silicon wafers.
Figure 16C:
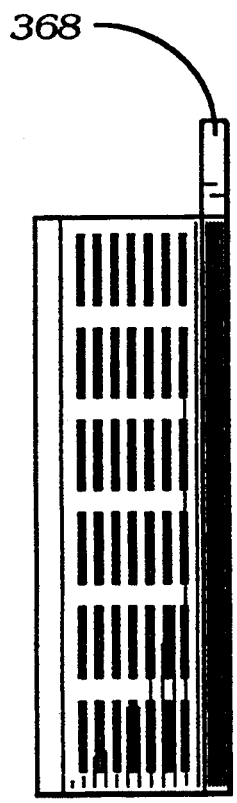
Figure 16A:
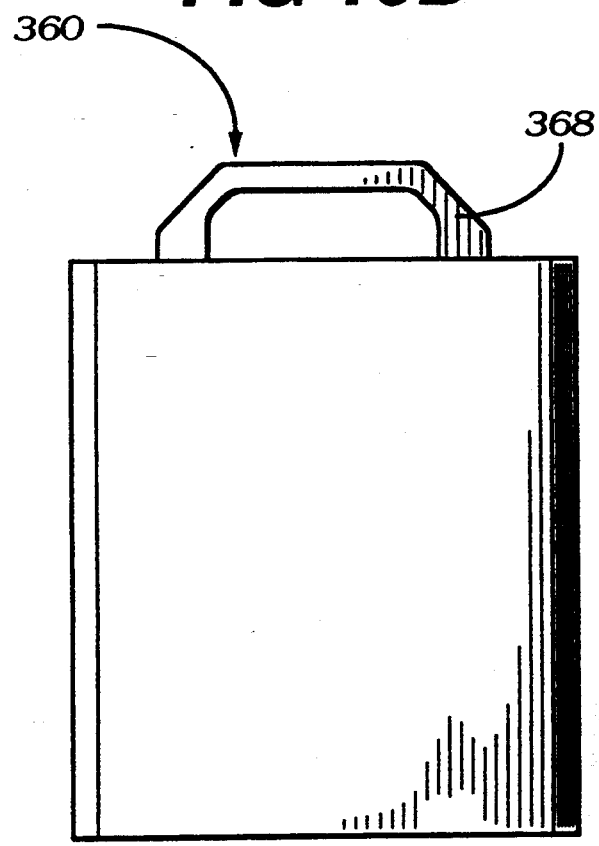
Figure 16D:
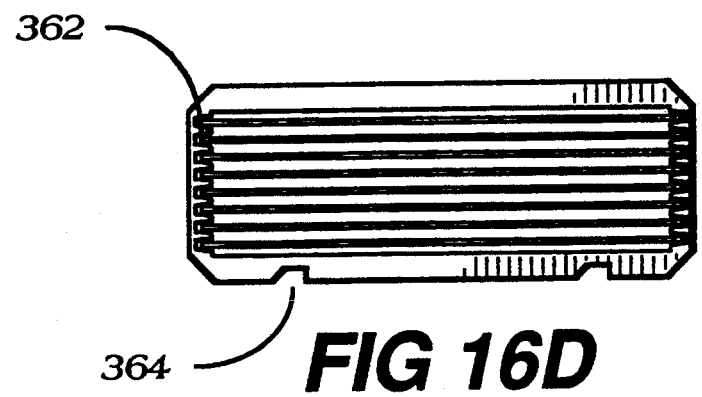
Figure 17A:
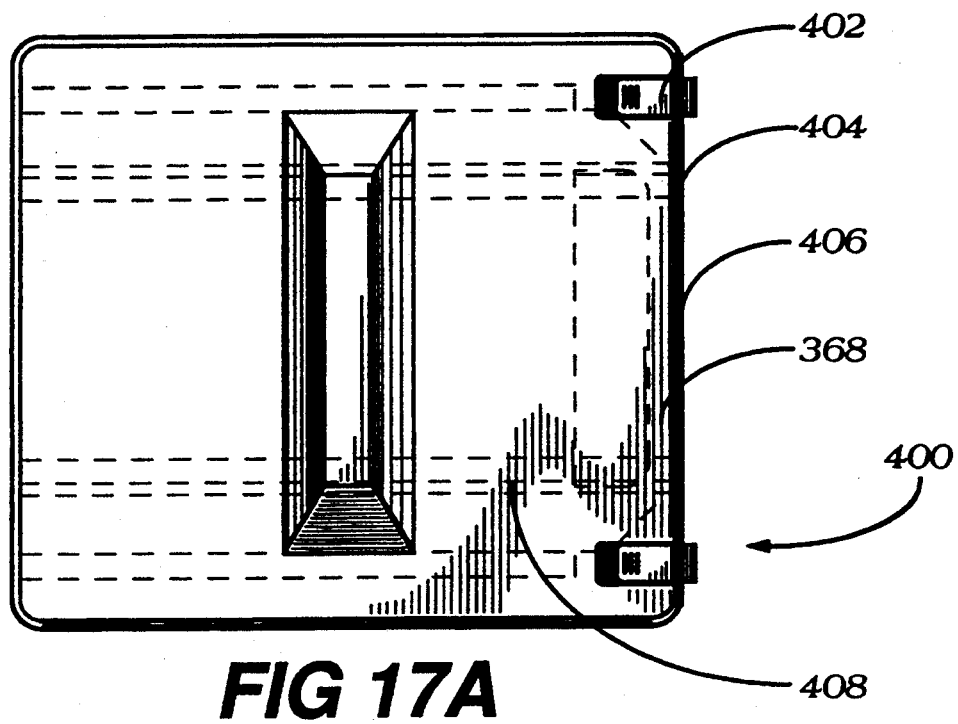
FIGS. 17A–C are top, side and front views, respectively, of a pod for enclosing and isolating the cassette of FIGS. 16A–D.
Figure 17B:
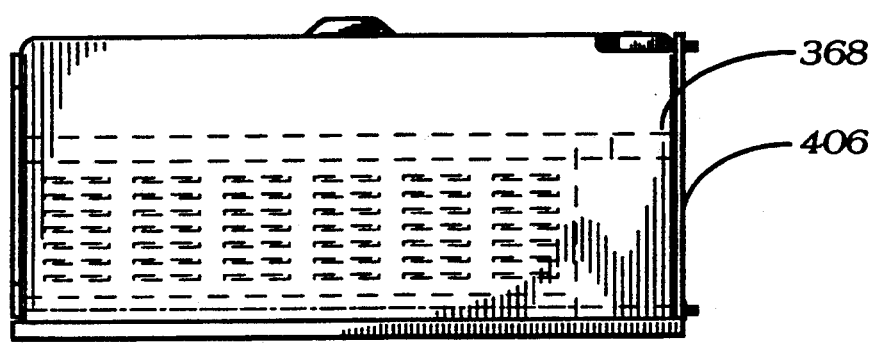
Figure 17C:
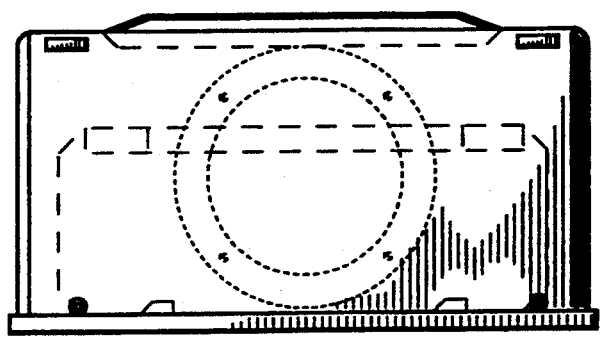

FIGS. 10–11 illustrate an alternative system 210 of the present invention which may enclose clean aisles, hallways, tunnels, or equivalent areas within facilities and permit chambers 14 to interface with, e.g., material transporting and handling robots or personnel. As shown in FIG. 10, system 210 may include a chamber 214, fluid supply plenum 218, filters 222, and a material transportation system 226. FIG. 11 also details environmental control equipment 230, including HVAC equipment 234, filters 238, and dampers 242 and 246, connected to chamber 214. Chamber 214 includes a perforated floor 250 and hollow walls or doors 254 which permit fluid to flow from equipment 230 through the floor 250 and be recirculated using the doors 254 and damper 246. Base plates 258 and other supports may be used to raise perforated floor 250 while isolating floor 250 from the remainder of the room in which it is located. To provide laminar flow throughout the interior of chamber 214, a diffuser 262, of size approximately the width of chamber 214, may be positioned immediately below filter 222.

Chamber 214 may be used to enclose the material transportation and handling system 226, including robot 266. FIG. 11 illustrates silicon wafers 270 being transported in cassettes 274 over monorails 278 and 282 to robot 266. Robot 266, functioning as an elevator in FIG. 11, then transports cassettes 274 via isolation sleeve 286 to one or more selected chambers 14, where the cassettes may be processed as appropriate by equipment 28. Should material handling system 226 be repositioned within chamber 14, however, supply plenum 218 and filters 222 are designed so as to fit flush against and be sealed to chamber 214.

As those ordinarily skilled in the art will recognize, chamber 214, like chamber 14, provides a connectable, modular means for isolating controlled areas, equipment—including processing, material handling and transportation, and other equipment—and, as shown in FIG. 11, personnel (if necessary), from ambient, contaminated air in the remainder of the rooms in which they are located. Those skilled in the art also will recognize that chambers 14 and 214, connectable via sleeve 286, can thus provide a complete system for isolating work pieces during the entirety of their processing. The modular construction of chambers 14 and 214 and results achieved while employing systems 10 and 210, moreover, permit systems 10 and 210 to be used in a variety of different applications and in a variety of industries. Systems 10 and 210 also accommodate numerous material handling mechanisms, including the Standard Mechanical Interface (SMIF) technology of, e.g., Asyst Technologies, Inc., and both manual and automated handling schemes. Finally, many of the features of chambers 14 and 214 may be interchangeable, so that, for example, chamber 14 may include a diffuser 262 (see FIG. 11) to assist in providing laminar flow throughout the substantially A-shaped chamber 14, or a perforated floor 250 designed to recirculate fluid through openings in the bottoms of modified cover ducts 30.

MIXFLOW STORAGE ENCLOSURE DESCRIPTION

The enclosure 300 illustrated in FIGS. 12–15 is a Class 1 (0.2 μm) one-pass/mixflow (VLF-Vertical laminar flow and HLF-Horizontal laminar flow) design and draws air from a HVAC temperature/humidity unit 302 which will then draw make up air (100%) from the facility ambient air. The enclosure 300 will be located in an open ballroom cleanroom (Class 100K, +/−10° F. or greater, +/−15% or greater). The enclosure 300 will employ ULPA filtration 328 (99.9997%) at the VLF and HLF areas feeding the product storage unit 304.

Panels 320 will be provided on all sides of the frame 322 and attached to the frame 322 via suitable captured fastening methods (e.g. male panel fasteners to, the female frame fasteners). The panel sizes can be determined based on the optimum modular coverage over the product storage unit configurations with the fewest panel sizes. The panels 320 can be double-wall sided to distribute supply air. They can be fabricated of sheet metal (epoxy painted) or sheet aluminum (epoxy painted) or molded plastic panels depending on the final design. Panels 320 can be mounted to an aluminum extruded inner frame 322 which holds a neoprene gasket (for panel-to-panel) sealing and a two plate manually adjustable aluminum supply air damper 312. A suitable inner frame 322 is then mounted to the product storage unit frame.

A common supply duct 332 fabricated from, for example, galvanized sheet steel can be employed and duct to the HVAC unit 302. In addition, a manual I/O air shower can be provided at the load/unload ports 338. This enclosure 302 can also include safety interlocks for the front and rear covers and the I/O, ionization bars 340, and lighting 342.

MIXFLOW STORAGE ENCLOSURE OPERATION

The enclosure 300 supply air is discharged both vertically, from the top of the enclosure, and horizontally from the front and rear, via the double-wall side panels 320. For improved management of the air flow, the VLF stream 306 will be set at a higher velocity (60–90 FPM) than the HLF stream 308 (15–20 FPM). This design can serve to drive air more efficiently across the box/cassette area. Adjusting the VLF and HLF supply air dampers 310, 312 along with the corner transition supply air dampers 314 allows for air flow optimization. The VLF stream 306 can be set at a higher velocity than that of the HLF stream 308. This is done to reduce turbulence as the two HLF streams, front and rear, 308, 309 merge with the VLF stream 306. In addition, the upper section of the enclosure 300 can be set at a slightly higher velocity than the lower section. This will accelerate the air stream toward the exhaust vents 316 located at the lower perimeter of the enclosure 300. Exhaust vent fans can be controlled in order to reduce pockets of turbulence within the enclosure 300.

PRODUCT TRANSPORT SYSTEM DESCRIPTION

The product transport system 350 illustrated in FIGS. 16–20 is a mobile cart 352 used to transfer and store manufactured clean products (such as wafers or flat panel displays) between Class 10 HEPA filtered product storage stations (WIP station) and Class 1 HEPA filtered mini-environments that enclose the manufacturing process equipment. Several embodiments of such Class 1 mini-environments are illustrated in FIGS. 1–15, any of which can be provided with an input/output section to interface with the product transfer system 350. The mobile cart 352 has a self-contained fan and filter section that continuously provides non-turbulent clean airflow across the product contained in the cart. There is also a semi-automated product transfer mechanism (load lock) used to transfer product carriers between the WIP stations and the mini-environments without exposing the products and product carriers to contaminated air outside of the cart 352 and storage or processing areas. There are operator controls and displays that support the transfer task and display the operating condition of the blower/filter mechanism.

The product transport system 350 may be assembled with a static dissipative acrylic exterior and an aluminum anodized frame. One side of the cart 354 contains a fan filter section (powered by, e.g., a 4 hour battery) which provides clean ULPA filtered air (99.9997 efficient at 0.3 um) horizontally across the interior of the system 350 at an airflow rate of 20–30 FPM. The air is relieved from this area by means of outlet dampers 356 which are adjusted to provide non-turbulent airflow across the product 358 and cassette 360. The product 358 and cassette 360 are positioned in a manner which allows the airflow to pass through all eight plates 362 housed in the cassette 360.

The cassette 360 is molded or otherwise formed to house the eight plates 362 and is notched 364 to form fit around two sliding track rails 366 made of non-particulating material such as stainless steel or teflon. A molded handle 368 is placed on one end of the cassette 360 to enable easy movement of the cassette 360 both into and out of the transport system 350. One end of the transport system 350 is equipped with a glove port 370 that is used by operators to slide the cassette 360 in and out of this area. Located at the other end of the glove port 370 is a sliding access door 372 which is controlled by a motorized sliding mechanism that lifts the sliding access door 372. A control panel 374 is built into the transport system to employ On/Off window slide buttons, a product transport system attachment "indicator" light, and a battery low "indicator" light. The sliding access door area of the cart also contains an attachment stem 376 which allows the transport system 350 to lock against the mini environment I/O area. The stem 376 also serves another purpose in that it houses control pins which carry electrical signals from the cart control system to indicate whether the proper attachment of the transport system and the mini environment/pod systems were successful.

Figure 20:
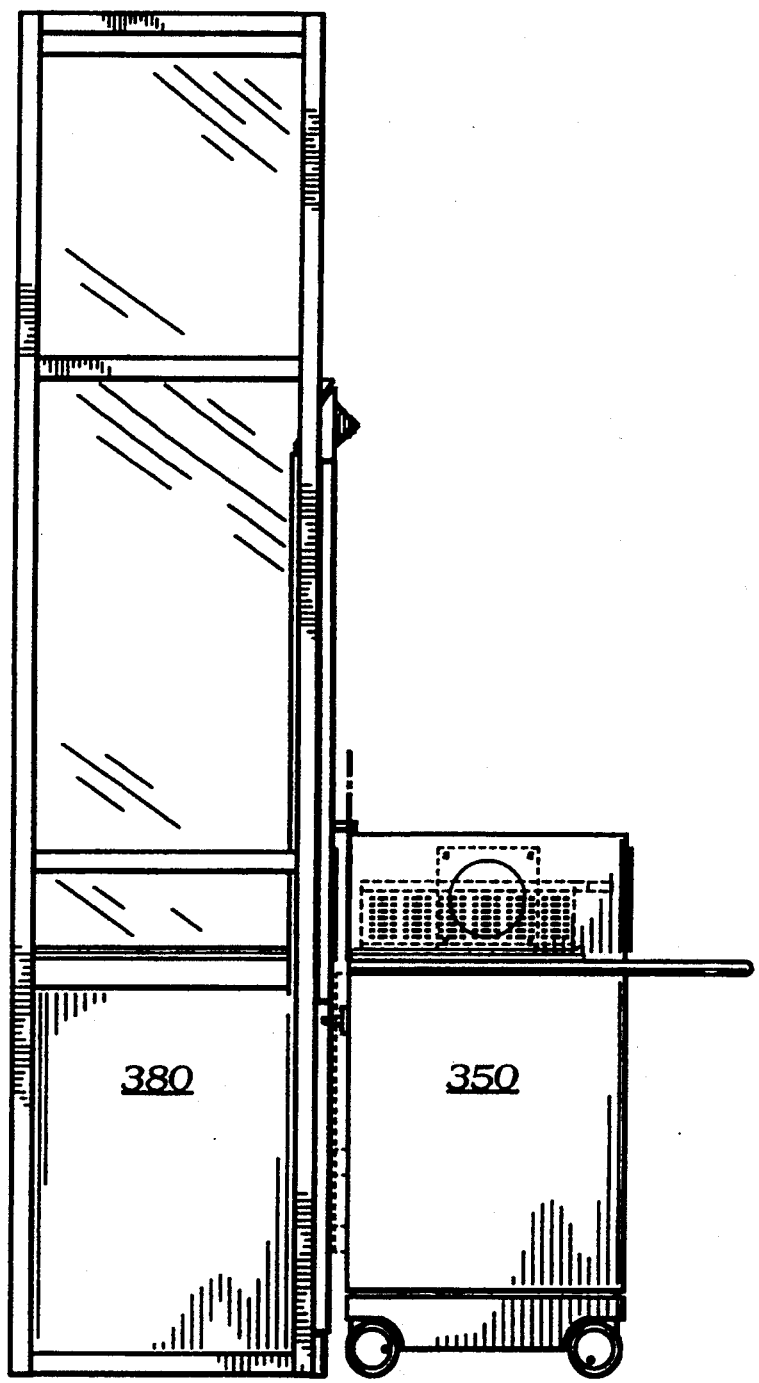
FIG. 20 is a side view of the product transport system shown in FIGS. 18A–C engaged with the input/output section shown in FIGS. 19A–C.

The product transport system 350 introduces cassettes 360 of product 358 to mini environments 380 in the following manner. The system is pushed up to the mini environment 380 and the front indicator stem 376 is pushed into a slot connector 382 built into the mini environment input/output (I/O) section 381. The slot connector 382 opening also contains electrical pins which enable the product transport systems control circuitry to be energized and as a result, the attachment "indicator" light comes on when the system is in the proper load/unload position. The transport system sliding access door 372 contains two extension pins 378 which fit into two "C" channels 384 located on the mini environment input/output sliding window 386. The operator pushes the "On" window slide button and the sliding access door 372 rises upward along with the mini environment sliding window 386. The airflow within the mini environment I/O area 381 is balanced in a manner to minimize turbulence and cross-flow of air from the I/O area 381 to the transport system 350. The operator places one hand in the glove port 370 and pushes the cassette 360 forward on the sliding track rail 366 from the transport system 350 to the mini environment 380 I/O track system 388. A stop ramp is placed at the end of the I/O track 388 to limit the cassette 360 from being pushed too far into the enclosure 380. The "Off" window button is then pushed and both the product transfer and I/O doors are closed. The transfer cart 352 is then pulled away from the front of the mini environment 380 and the operator can then access the I/O area 381 (if necessary) by opening the operator window which contains a glove box. The operator shall then place the gloves on their hands (while the clean air is blowing from the enclosure) and begin to perform manual transfer duties. When the cassette 360 needs to be removed, the cart 352 is rolled back up to the environment 380 and the indicator stem 366 is again connected to the I/O area 381. All procedures described above are repeated except for the fact that the cassette handle 368 is pulled back from the I/O area 381 (by the operator) into the transport system 350, as shown in FIG. 20.

The pods 400 which house the cassettes 360 may consist of a plastic which is molded in a 18"×22"×8" section. One end of the pod 400 contains two sliders which allow the access door 406 to be slid upward and downward. When the access door 406 is in the closed position, a mechanical latch 402 is fastened to pressurize the door 406 downward into an exterior gasket (located around the access door 406) to prevent contamination migration into the pod 400. Also, a gasket 404 (made of Viton or any other suitable material) located on the interior of the sliding door 406 places pressure on the cassette handle 368 and provides a means of displacing pressure against the cassette 360 to prevent it from moving during transfer.

Figure 18A:
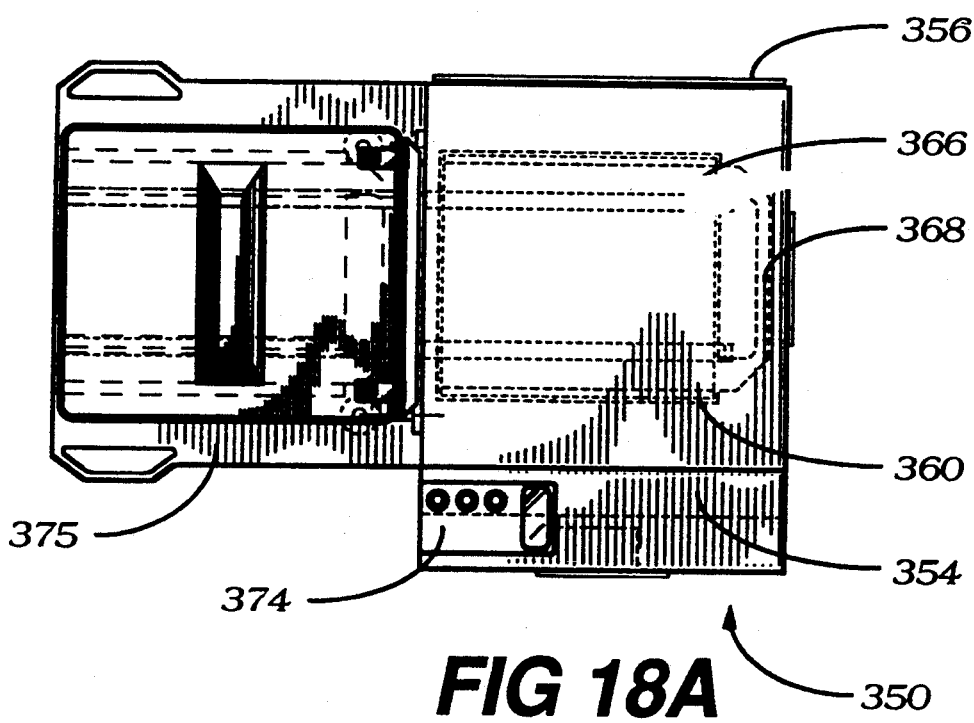
FIGS. 18A–C are top, side and front views, respectively, of a product transport system.
Figure 18B:
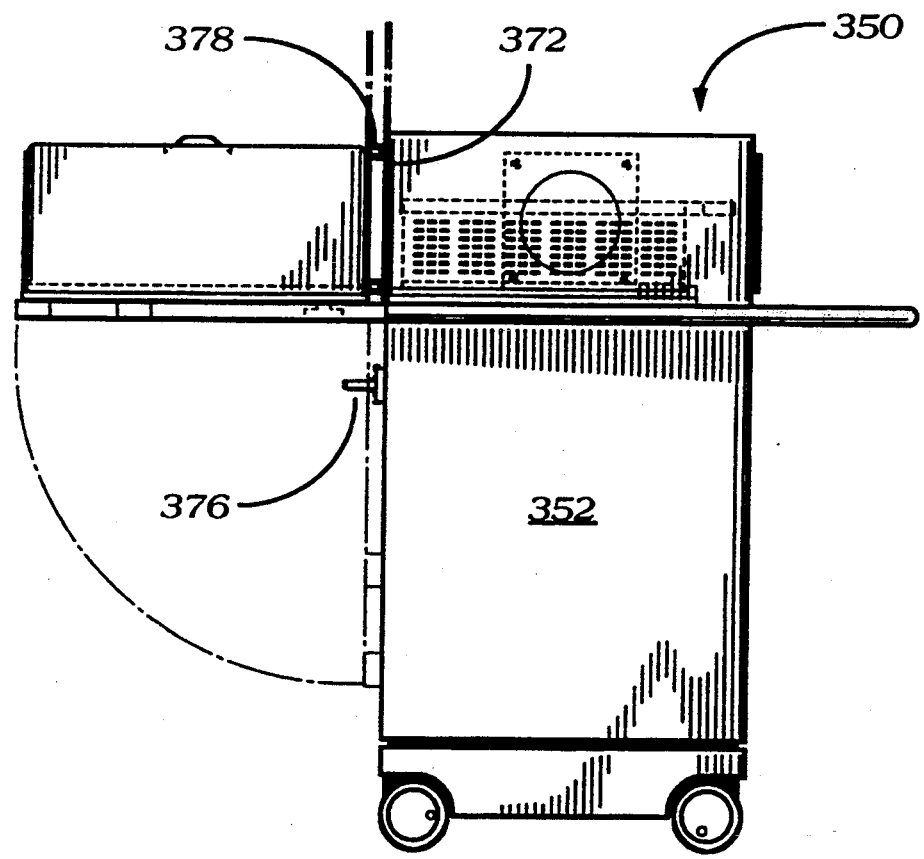
Figure 18C:
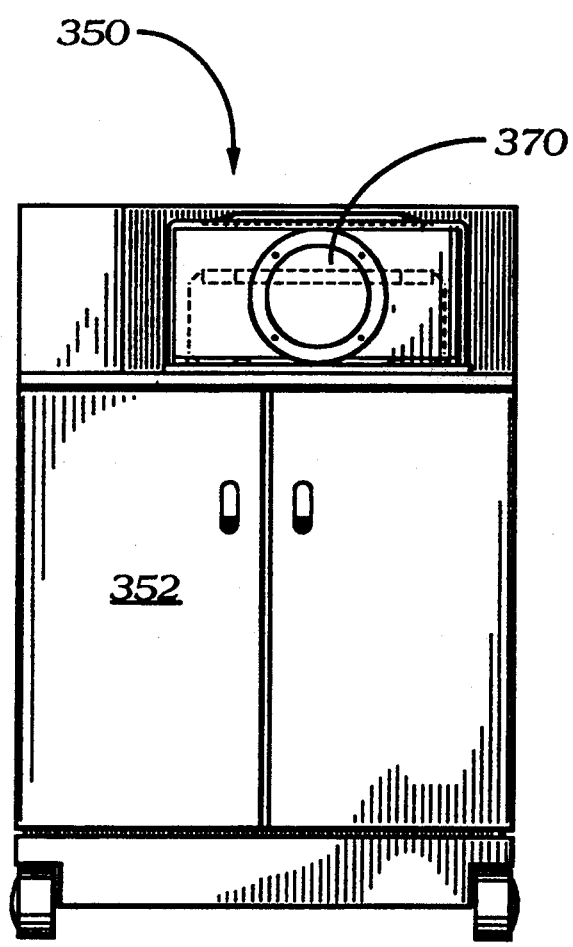

As shown in FIG. 18, the pod 400 is opened in basically the same manner as the mini environment sliding doors 406. The transport system 350 has a shelf 375 which is lifted and locked into place in front of the sliding door 372. The pod 400 is placed on a shelf 375 and is slid into place by interlocking the attachment stem and the pod slot connector. The transport system attachment light will turn "on" when proper alignment has been achieved. The transport system sliding window extension pins 378 fit into the pod "C" channels and when the transport system window "on" button is pressed, both windows rise. The cassette 360 is removed from the pod 400 by means of an operator (using the glove port) sliding the cassette 360 from the internal pod track rails 408 to the transport system 350. The window "off" button is then pushed and both the transport system and pod windows close. The mechanical latch 402 is then closed and the pod 400 is pulled away from the transport system 350.

WIP stations are designed to contain and store pods in a class 10 (measured at 0.3 um particle size) environment. The blower system is located at the top of the WIP storage unit and air is discharged through a panel system and a "packaged" filter section which provides 20 FPM of clean airflow.

The foregoing is provided for purposes of illustration, explanation, and description of embodiments of the present invention. Modifications and adaptations to these embodiments will be apparent to those of ordinary skill in the art and may be made without departing from the scope or spirit of the invention.

What is claimed is:

1. A modular system including a chamber having an input/output section, for enclosing a work piece and isolating it from the remainder of the room in which the chamber is located, comprising:

a. an upper section defining an aperture for permitting fluid to enter the chamber;
   b. a filter, removably positioned within the chamber, for decontaminating the entering fluid;
   c. means, associated with the chamber, for causing the decontaminated fluid to flow over the work piece in laminar fashion;
   d. a hollow cover, attachable to the chamber, defining entrance and exit gaps for conveying the flowing fluid from a first location within the chamber to a second location outside the chamber;
   e. means, positioned within the chamber, for isolating the entering fluid from the flowing fluid exiting the exit gap of the hollow cover; and
   f. a product transport system adapted to be connected to the input/output section of the chamber, the product transport system defining a fan filter section for providing filtered fluid and comprising a pod for housing the work piece during transport to and from the chamber.

2. The modular system of claim 1 further comprising means for connecting the product transport system with the input/output section so that cross-flow of fluid between the chamber and the product transport system is minimized and so that minimal entry of fluid from the remainder of the room occurs.

3. A transport system including a frame having an interior and adapted to be connected to a modular chamber for enclosing a work piece and isolating it from the remainder of the room in which the transport system and chamber are located, comprising:

a. means for providing filtered fluid throughout the interior of the frame;
   b. means for detachably connecting the frame to the chamber;
   c. at least one rail formed within the interior of the frame; and
   d. a cassette, adapted to attach to and slide along the rail, for housing the work piece during transport to and from the chamber.

4. The product transport system of claim 3 further comprising means for accessing and manipulating the work piece.

5. The product transport system of claim 4 in which the accessing means is a glove port.

6. The product transport system of claim 2 in which the interior of the frame is isolated from the surrounding environment so that the work piece is enclosed.

7. The product transport system of claim 6 in which the interior of the frame is accessed through a sealable portal.

8. The product transport system of claim 2 further comprising means for monitoring the environment of the product transport system.

9. A modular chamber with an upper section for enclosing a work piece and isolating it from the remainder of the room in which the chamber is located, comprising:

a. an aperture within the upper section for permitting decontaminated first fluid to enter the chamber;
   b. means, associated with the chamber, for causing the decontaminated first fluid to flow vertically downward from the upper section;
   c. at least one wall comprising:
      i) a rear cover;
      ii) a filter;
      iii) means for channeling fluid into the wall;

iv) means for controlling the flow of fluid through the filter to produce decontaminated second fluid; and v) means for directing the flow of decontaminated second fluid into the chamber; and d. means for merging the decontaminated first fluid with the decontaminated second fluid so as to minimize the turbulence within the chamber.

10. The modular chamber of claim 9 further comprising a hollow covers attachable to at least one wall of the chamber, defining entrance and exit gaps for conveying fluid from a first location within the chamber to a second location outside the chamber.

11. The modular chamber of claim 10 further comprising means, positioned within the chamber, for isolating the decontaminated first and second fluid from the flowing fluid exiting the exit gap of the hollow cover.

12. The modular chamber of claim 9 further comprising an input/output section for accepting a product transport system adapted to be connected to the input/output section of the chamber.

13. The modular chamber of claim 12 in which the product transport system comprises a fan filter section for providing filtered fluid over a work piece during transport to and from the input/output section.

14. The modular chamber of claim 9 in which the controlling means comprises perforated sheets of material movable relative to one another so that the resistance offered to the decontaminated second fluid may be changed.

15. The modular chamber of claim 9 in which the merging means comprises a fan that maintains the velocity of the decontaminated first fluid higher than the velocity of the decontaminated second fluid.

16. A product transport system for use in combination with a modular environmental control system, the combination comprising:

a. the modular environmental control system including a chamber for enclosing a work piece and isolating it from a surrounding room, comprising:

i) an aperture for permitting fluid to enter the chamber;

ii) a filter for decontaminating the entering fluid;

iii) means, associated with the chamber, for causing the decontaminated fluid to flow over the work piece in laminar fashion;

(iv) means for conveying the flowing fluid from a first location within the chamber to a second location outside the chamber; and (v) an input/output section, located within the chamber, comprising means for interfacing with the product transfer system and means for receiving the work piece; and b. the product transport system including a frame having an interior and adapted to be connected to the modular environmental control system, comprising:

i) means for providing filtered fluid throughout the interior of the frame;

ii) means for detachably connecting the frame to the input/output section of the chamber; and iii) at least one rail formed within the interior of the frame for transferring a work piece between the product transfer system and the input/output section of the modular chamber.

17. The combination of claim 16 in which the conveying means comprises a hollow cover, attachable to at least one wall of the chamber, defining entrance and exit gaps.

18. The combination of claim 16 in which the interfacing means comprises portals in each of the product transport system and the input/output section that mate together.

19. The combination of claim 18 further comprising means for determining whether the portals are sealed so that exposure of the work piece to fluid from the surrounding room is minimized.

20. The combination of claim 16 in which the chamber further comprises:

a. a rear cover and a front cover;

b. a second filter;

c. means for channeling fluid between the rear and front covers;

d. means for controlling the flow of fluid through the second filter to produce decontaminated second fluid; and e. means for directing, in a generally horizontal direction, the flow of decontaminated second fluid through the front cover and into the chamber.

* * * * *

UNITED STATES PATENT AND TRADEMARK OFFICE
CERTIFICATE OF CORRECTION

PATENT NO. : 5,401,212

DATED : March 28, 1995

INVENTOR(S) : Greg A. Marvell, et al.

It is certified that error appears in the above-indentified patent and that said Letters Patent is hereby corrected as shown below:

Column 5, line 21, delete "741" and insert --74--

Column 9, line 8, delete the comma after the word "to"

Signed and Sealed this

Seventh Day of May, 1996

Attest:

BRUCE LEHMAN

Attesting Officer

Commissioner of Patents and Trademarks